(12) United States Patent
Mizushima et al.

(10) Patent No.: US 7,718,483 B2
(45) Date of Patent: May 18, 2010

(54) METHOD OF MANUFACTURING NON-VOLATILE SEMICONDUCTOR MEMORY

(75) Inventors: Ichiro Mizushima, Yokohama (JP); Hajime Nagano, Yokkaichi (JP); Yoshio Ozawa, Yokohama (JP); Hisataka Meguro, Yokohama (JP); Takashi Suzuki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 493 days.

(21) Appl. No.: 11/399,655

(22) Filed: Apr. 7, 2006

(65) Prior Publication Data

US 2006/0258076 A1    Nov. 16, 2006

(30) Foreign Application Priority Data

Apr. 8, 2005   (JP) ............................. 2005-112478

(51) Int. Cl.
*H01L 21/8238* (2006.01)

(52) U.S. Cl. .............................. 438/201; 257/E21.548; 257/E21.645

(58) Field of Classification Search ......... 438/255–266, 438/201; 257/E21.548, E21.645
See application file for complete search history.

(56) References Cited

U.S. PATENT DOCUMENTS

| | | | |
|---|---|---|---|
| 5,599,724 A | 2/1997 | Yoshida | |
| 5,705,885 A | 1/1998 | Yamada et al. | |
| 6,555,427 B1 | 4/2003 | Shimizu et al. | |
| 6,713,834 B2 | 3/2004 | Mori et al. | |
| 6,806,132 B2 | 10/2004 | Mori et al. | |
| 6,818,508 B2 | 11/2004 | Shimizu et al. | |
| 6,927,990 B2 | 8/2005 | Mukai | |
| 7,061,069 B2 | 6/2006 | Mori et al. | |
| 7,122,432 B2 | 10/2006 | Shimizu et al. | |
| 7,420,259 B2 | 9/2008 | Mori et al. | |
| 2002/0154561 A1 | 10/2002 | Graaff | |
| 2004/0229422 A1 | 11/2004 | Mori et al. | |

FOREIGN PATENT DOCUMENTS

| | | |
|---|---|---|
| EP | 1 276 148 A2 | 1/2003 |
| JP | H10-135357 | 5/1998 |
| JP | H10-256399 | 9/1998 |
| JP | 2001-118944 | 4/2001 |
| JP | 2001-284556 | 10/2001 |
| JP | 2002-203919 | 7/2002 |

(Continued)

OTHER PUBLICATIONS

Japanese Patent Office, Office Action, Dec. 4, 2008, 4 pages.

(Continued)

*Primary Examiner*—W. David Coleman
*Assistant Examiner*—Sonya D McCall-Shepard
(74) *Attorney, Agent, or Firm*—Finnegan, Henderson, Farabow, Garrett & Dunner, L.L.P.

(57) ABSTRACT

In a method for manufacturing a non-volatile semiconductor device according to this invention, steps are provided for forming a plurality of first semiconductor portions over a substrate; selectively growing a plurality of second semiconductor portions in contacting with said plurality of first semiconductor portions respectively; partially removing said plurality of second semiconductor portions to prepare a plurality of floating gates with substantially flat surfaces; forming an insulating layer over said plurality of floating gates; and forming a control gate over said insulating layer.

12 Claims, 22 Drawing Sheets

FOREIGN PATENT DOCUMENTS

| | | |
|---|---|---|
| JP | 2002-368139 | 12/2002 |
| JP | 2003-7869 | 1/2003 |
| JP | 2003-078044 | 3/2003 |
| JP | 2004-55617 | 2/2004 |

OTHER PUBLICATIONS

Tetsuo Endoh et al., Novel Ultrahigh-Density Flash Memory With a Stacked-Surrounding Gate Transistor (S-SGT) Structured Cell, IEEE Transactions on Electron Devices, vol. 50, No. 4, pp. 945-951, Apr. 2003.

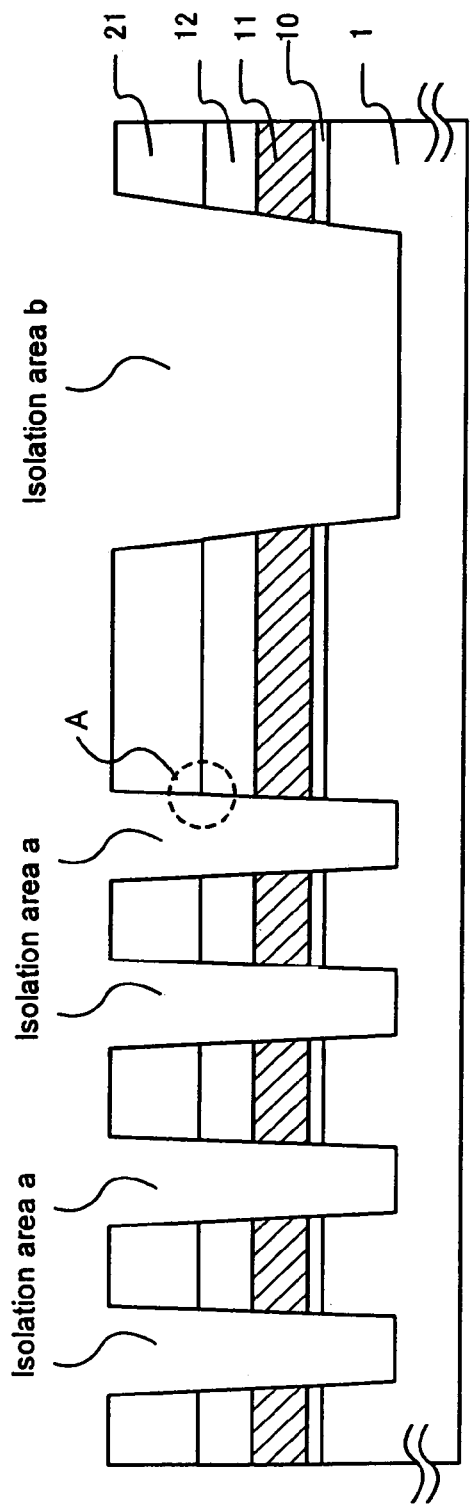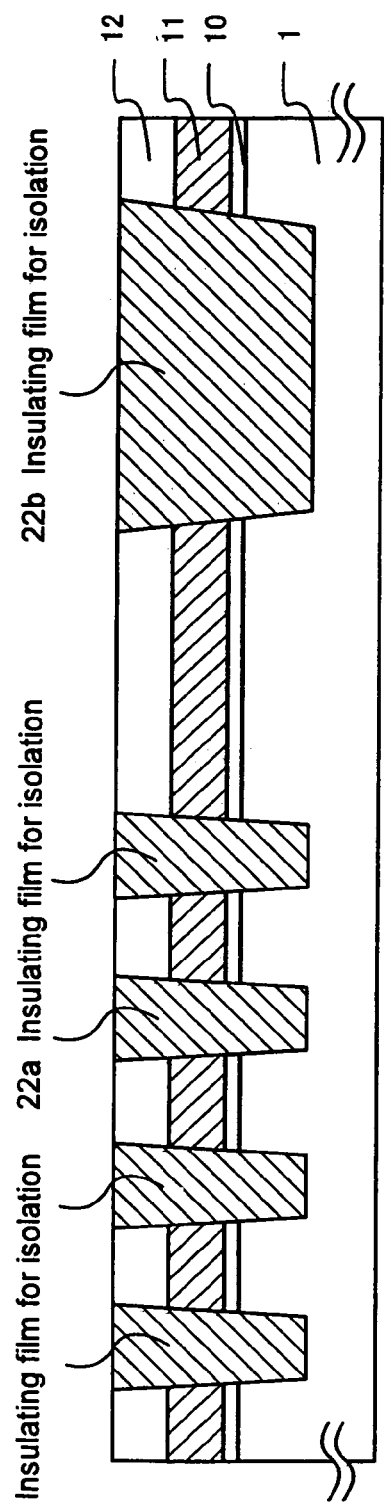

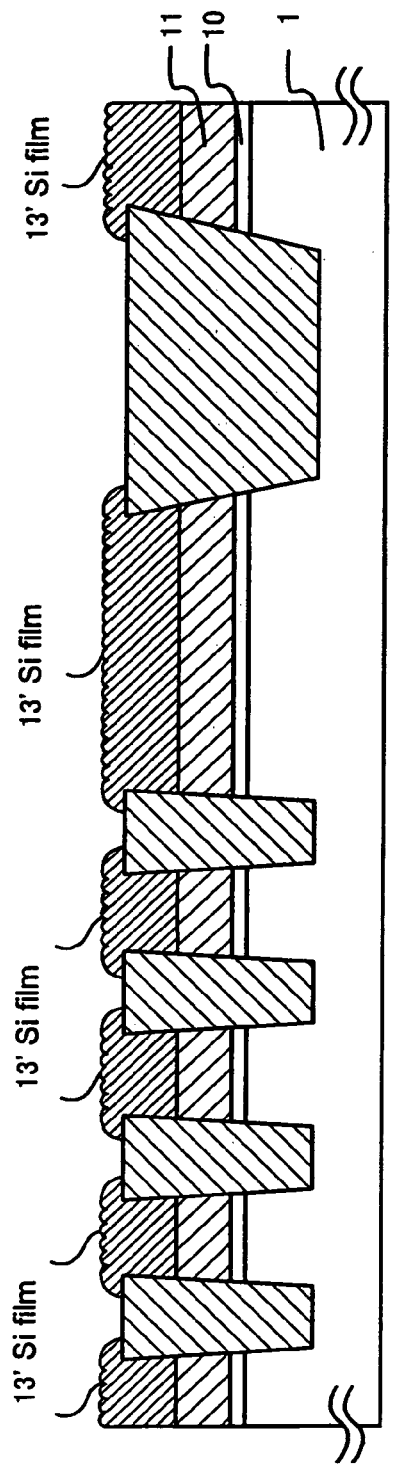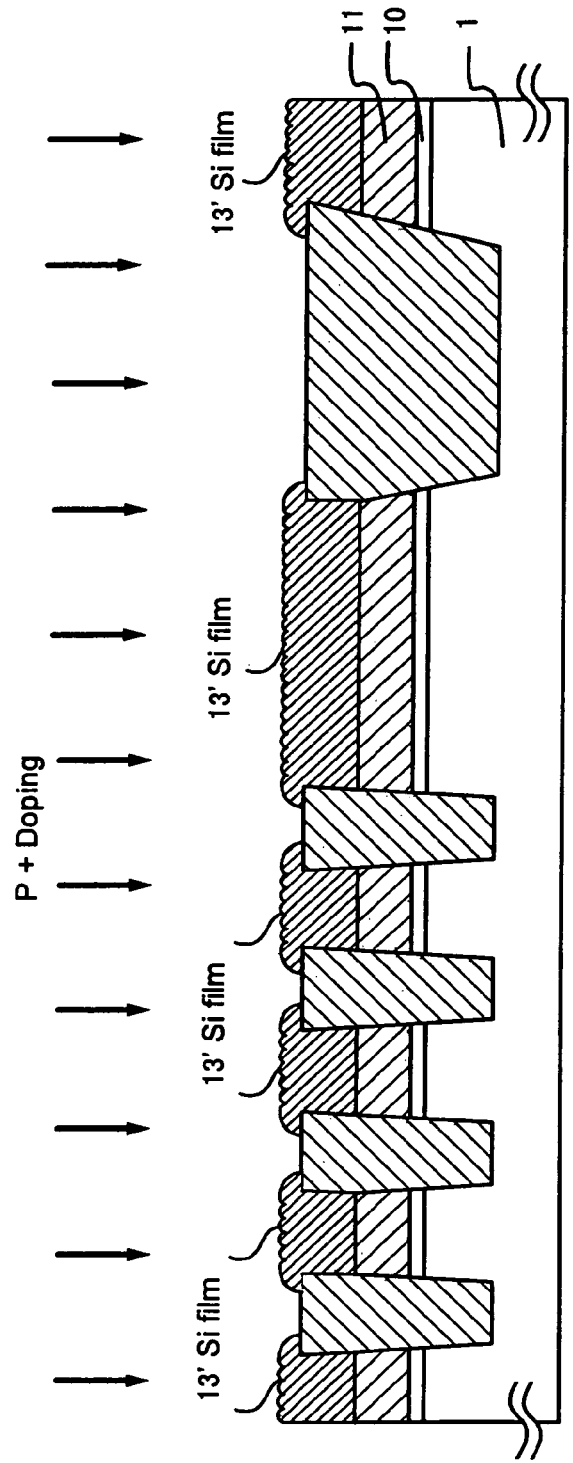
Fig.7(f-1)
Fig.7(f-2)

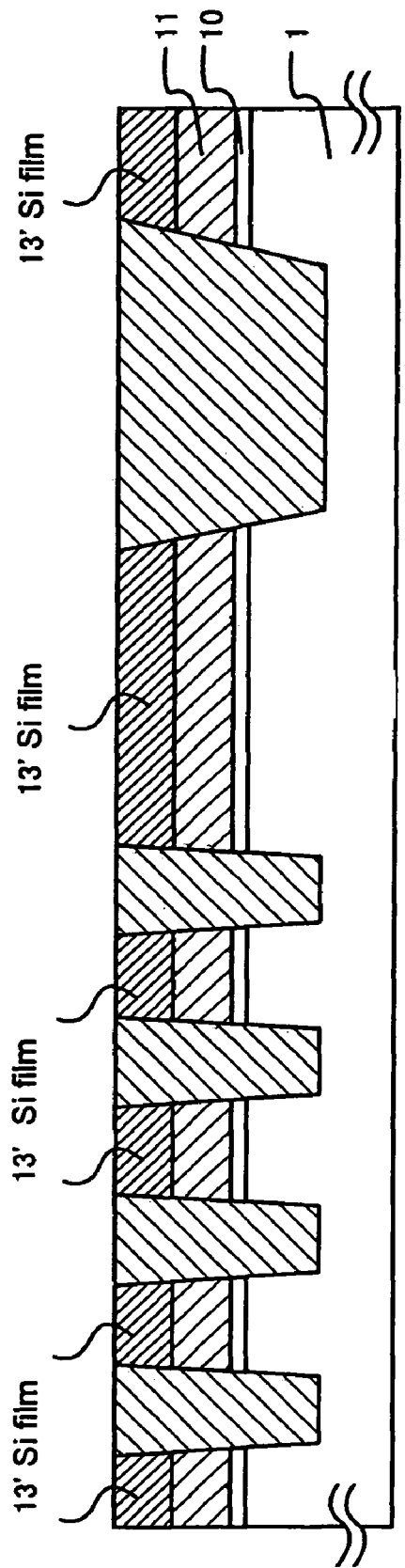
Fig.8(g-1)

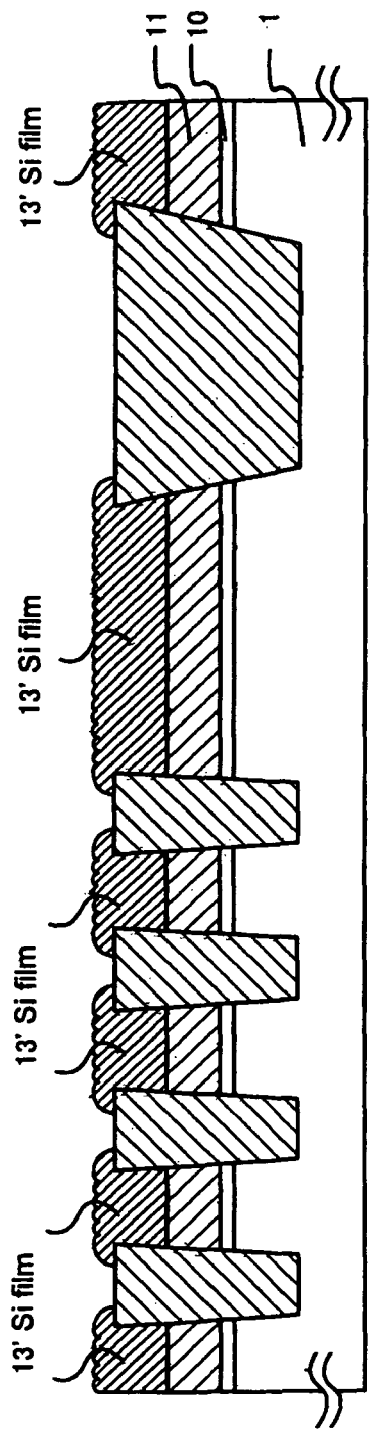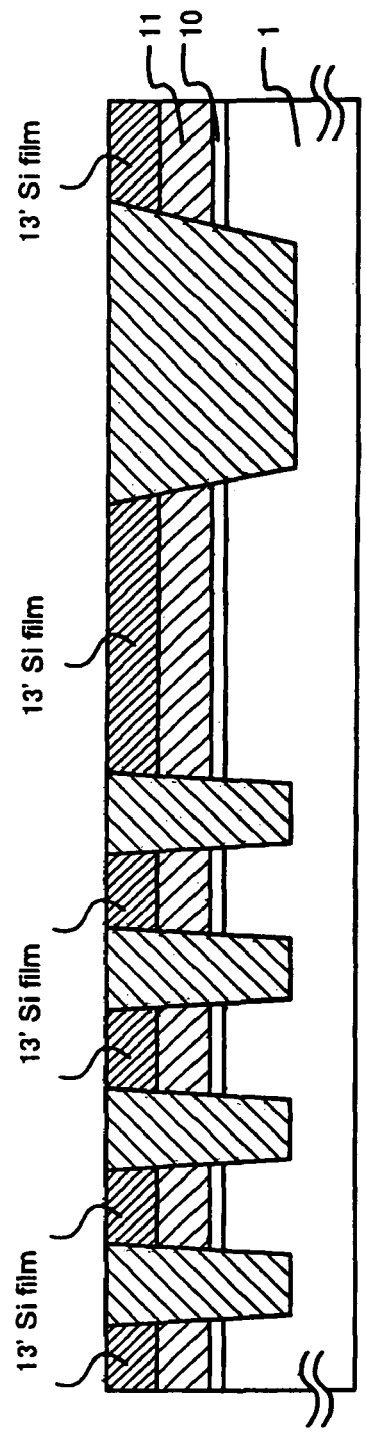
Fig.9(f-1)
Fig.9(f-2)

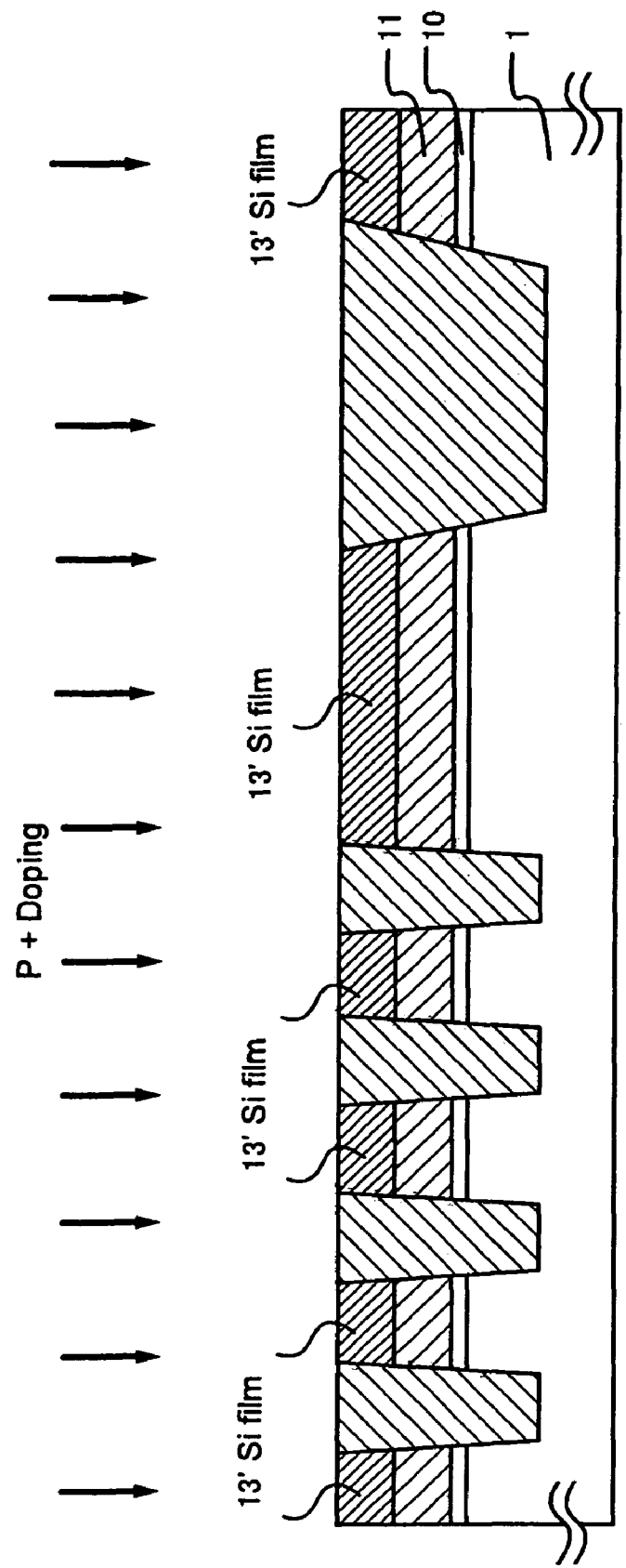
Fig.10(g-3)

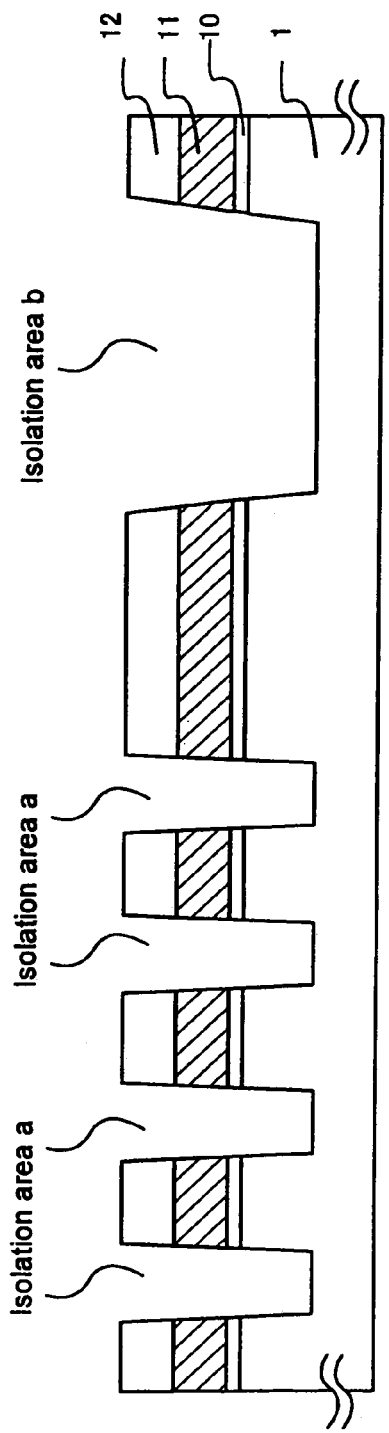
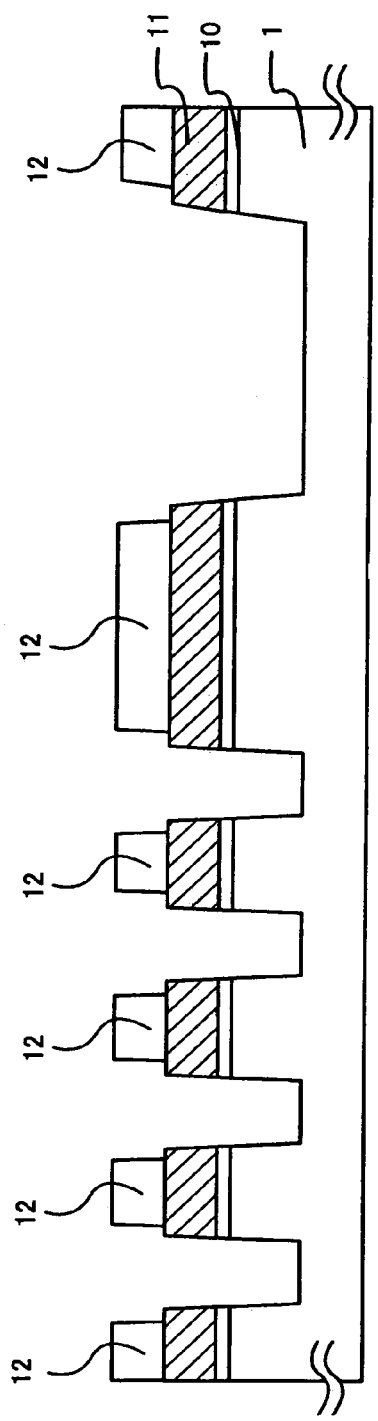
Fig.11(c-1)
Fig.11(c-2)

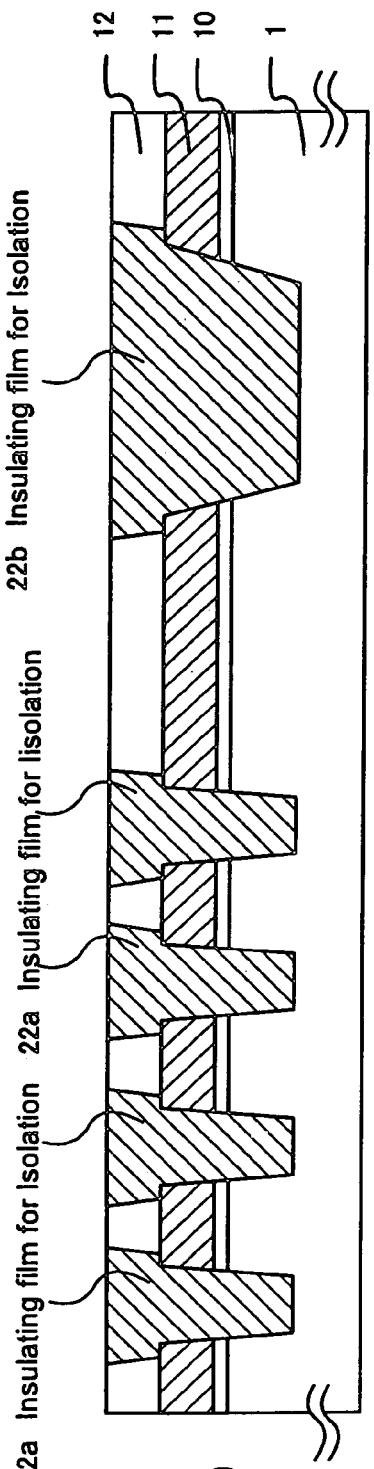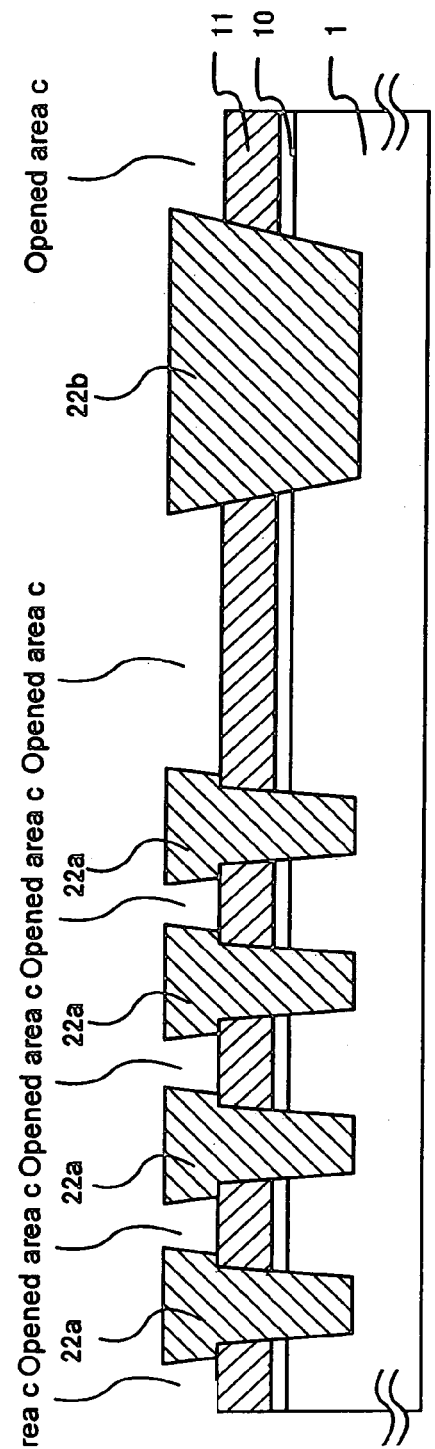

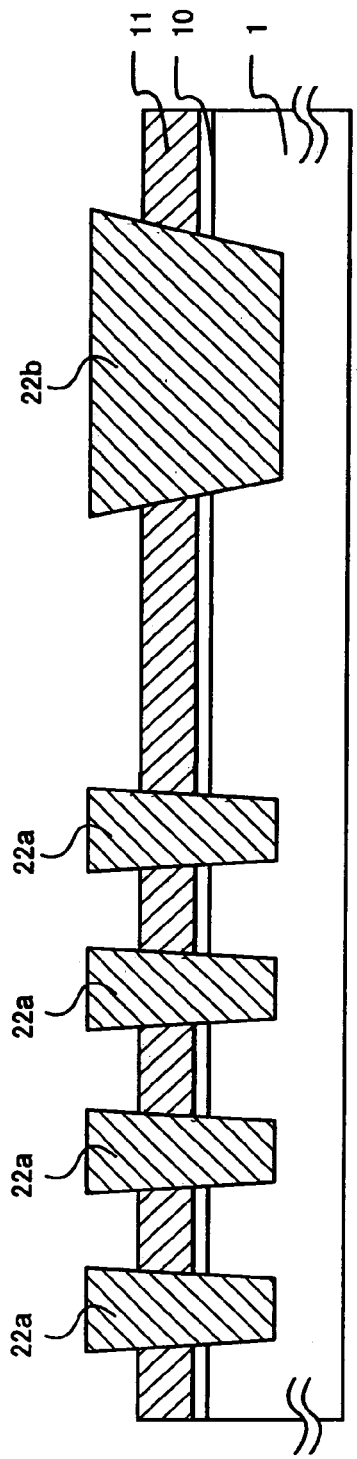
Fig.13(e)
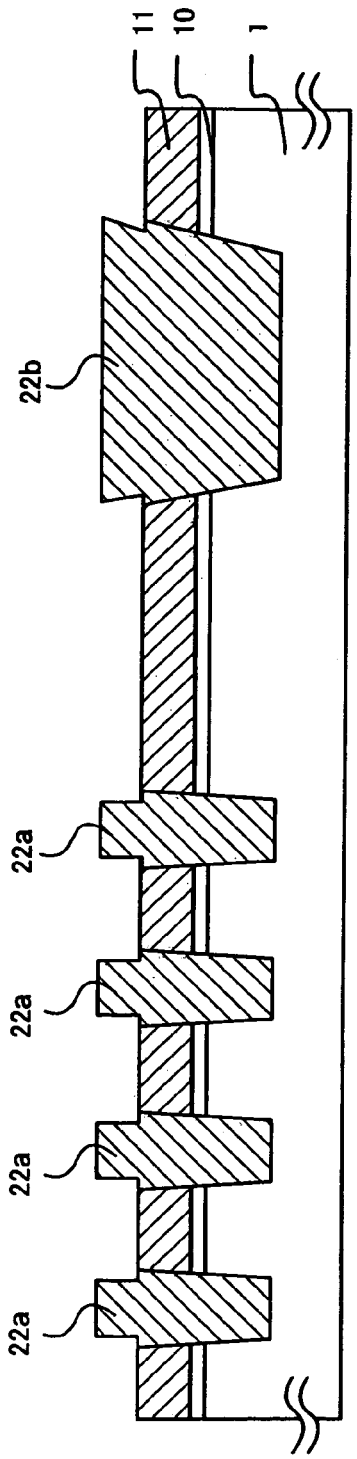
Fig.13(e-1)

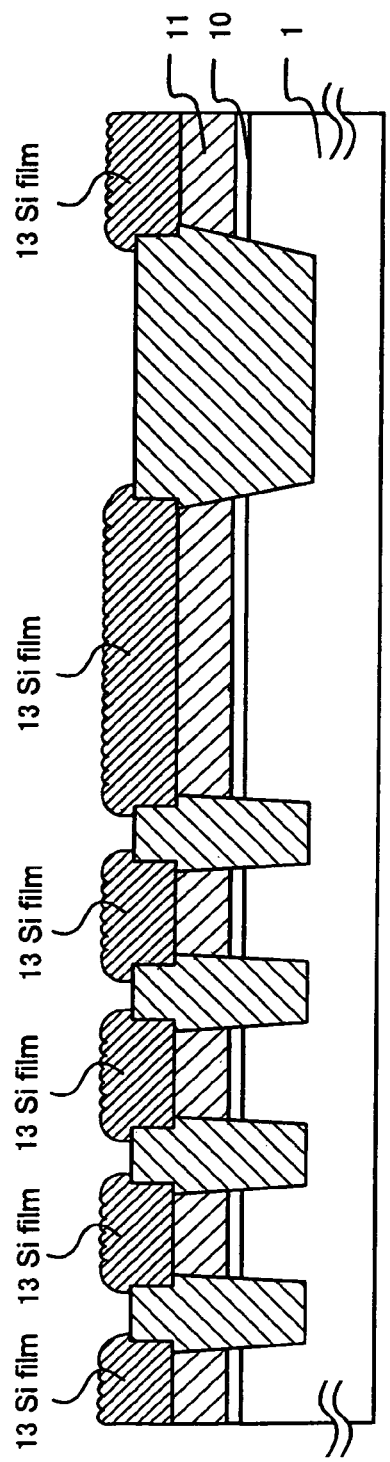
Fig.14(f-2)
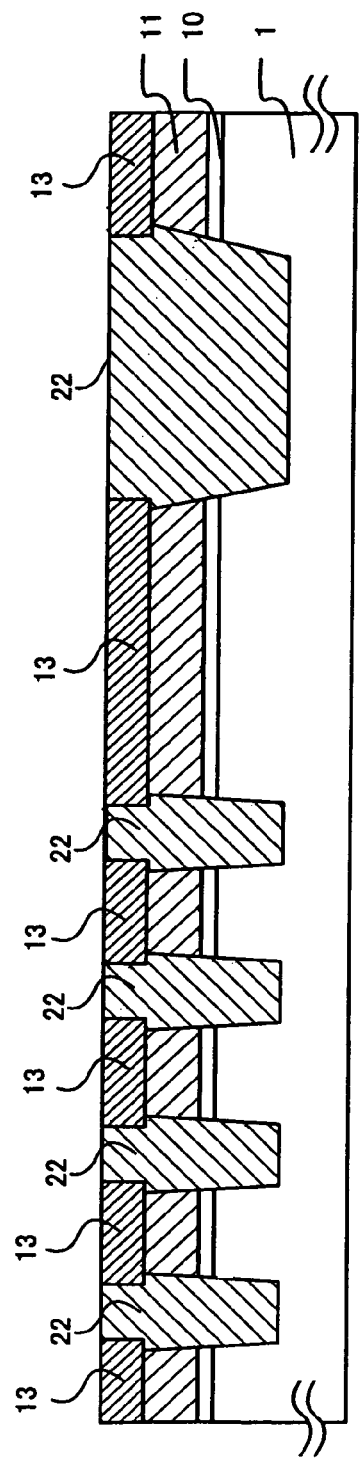
Fig.14(g-4)

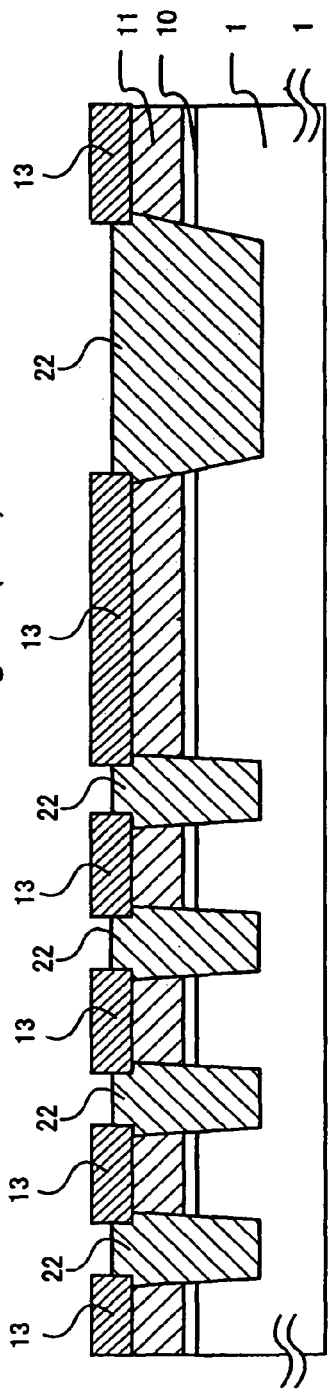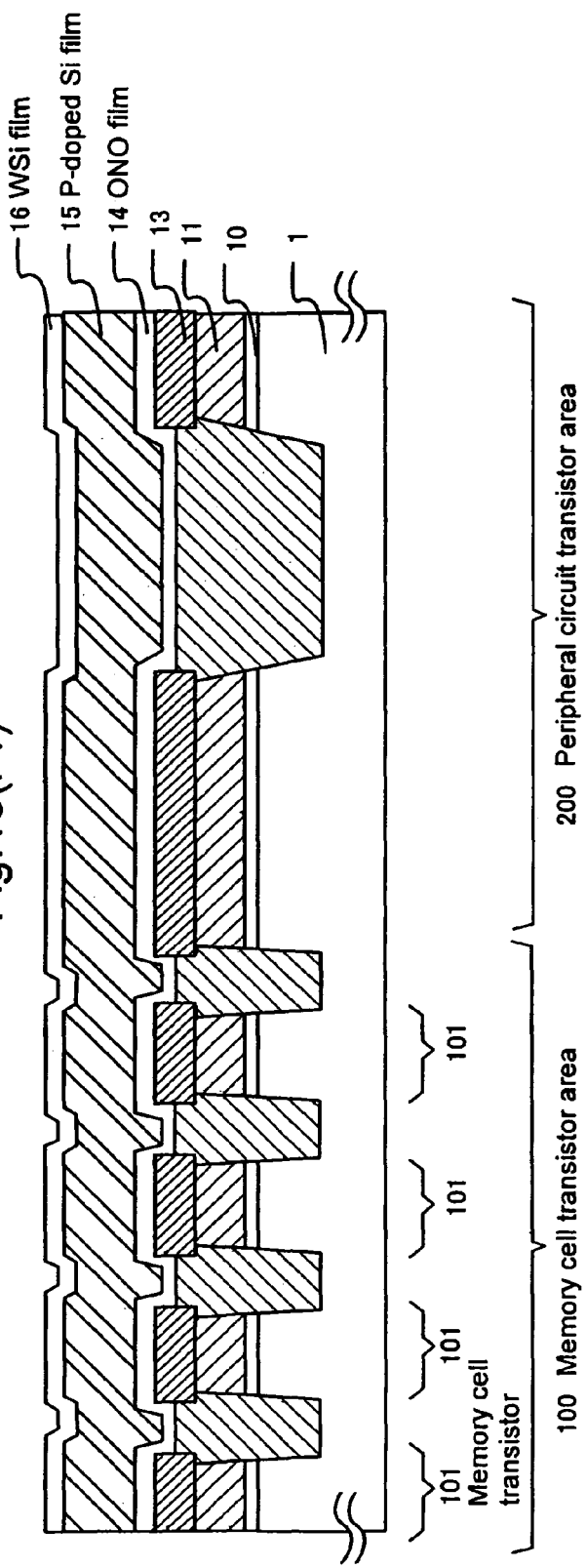

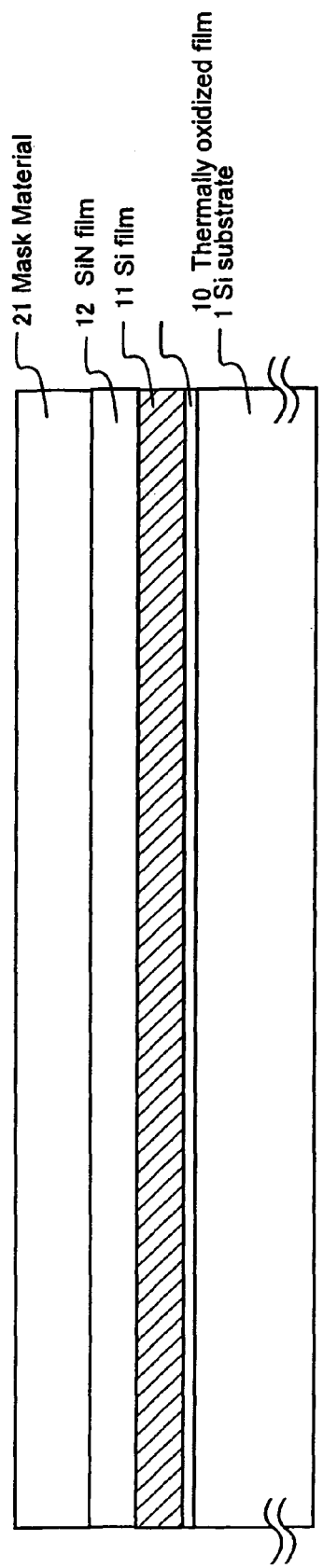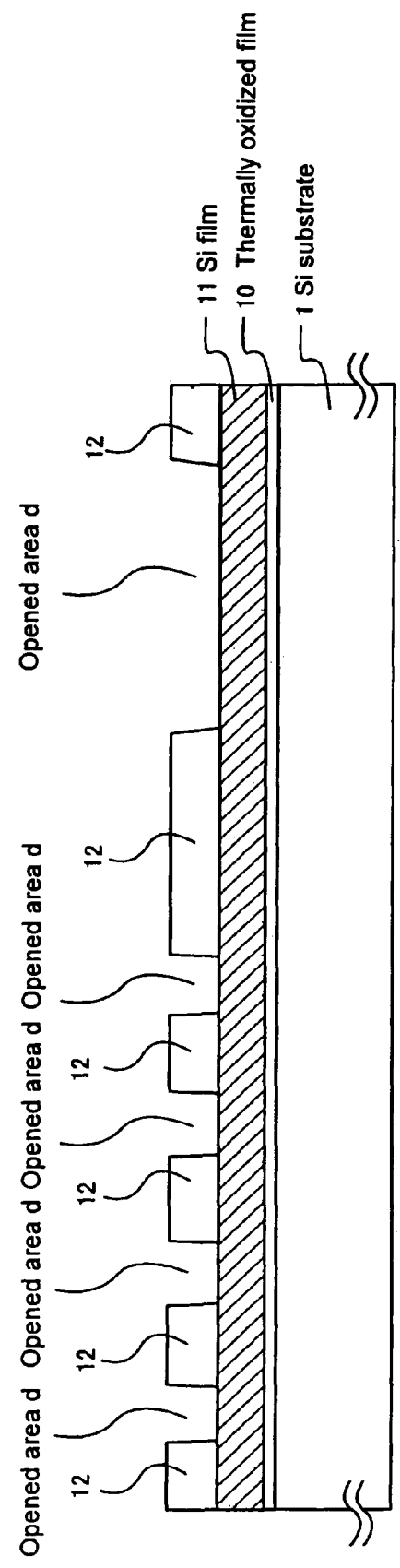

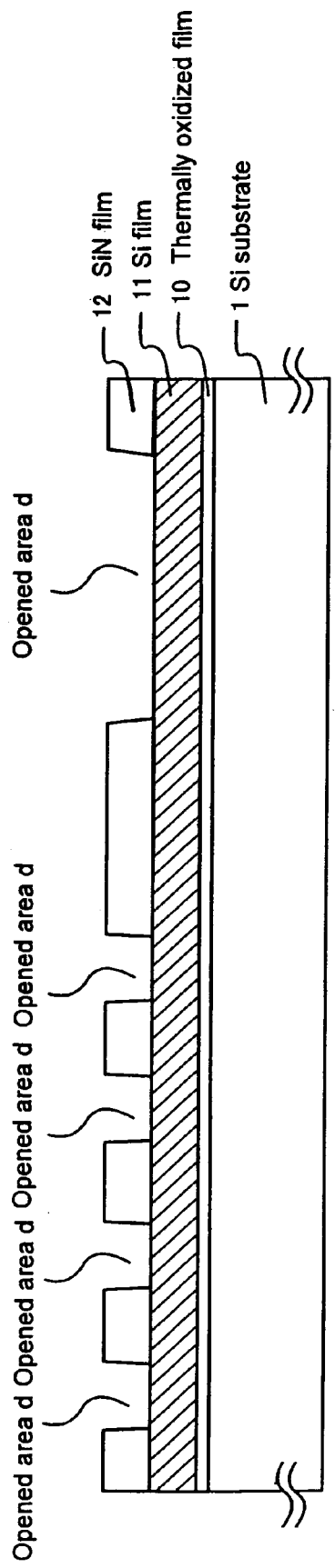
Fig.17(c-4)
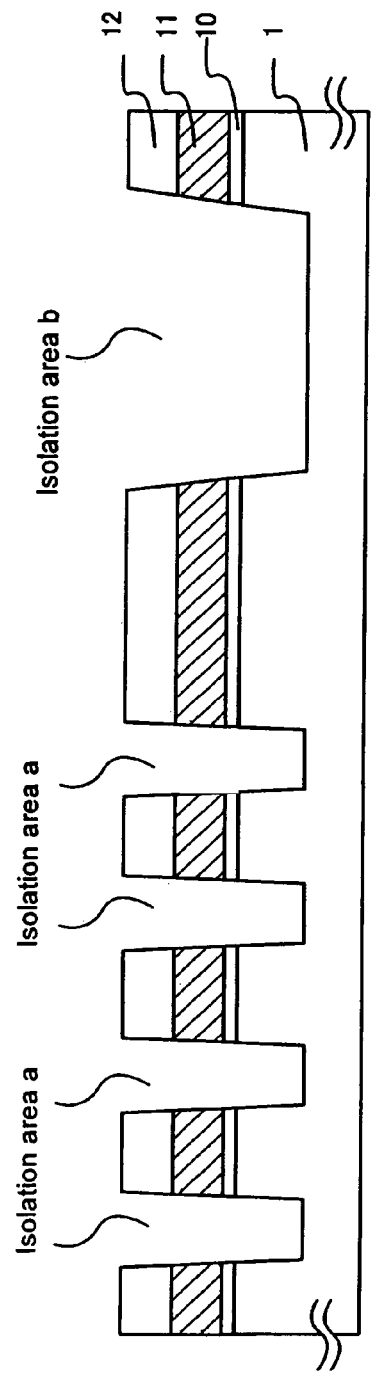
Fig.17(c-5)

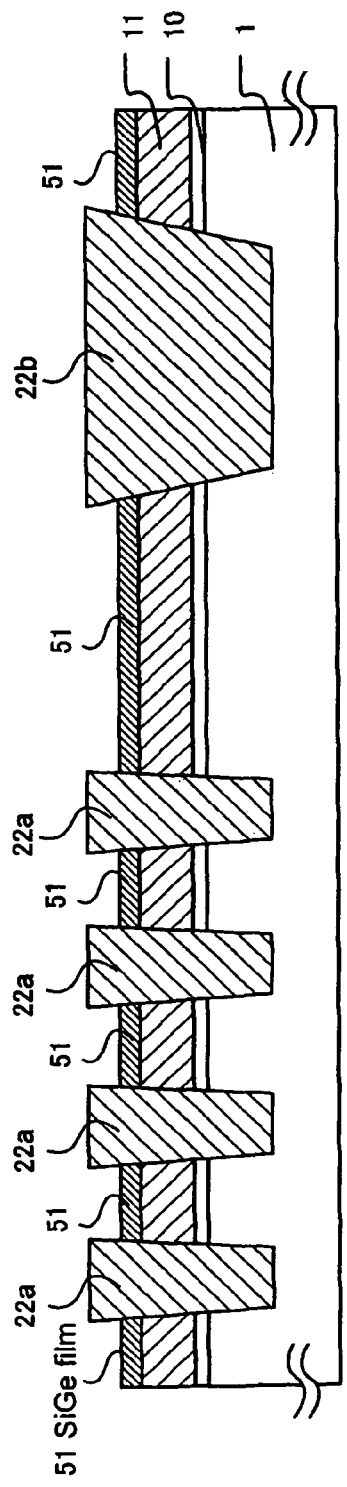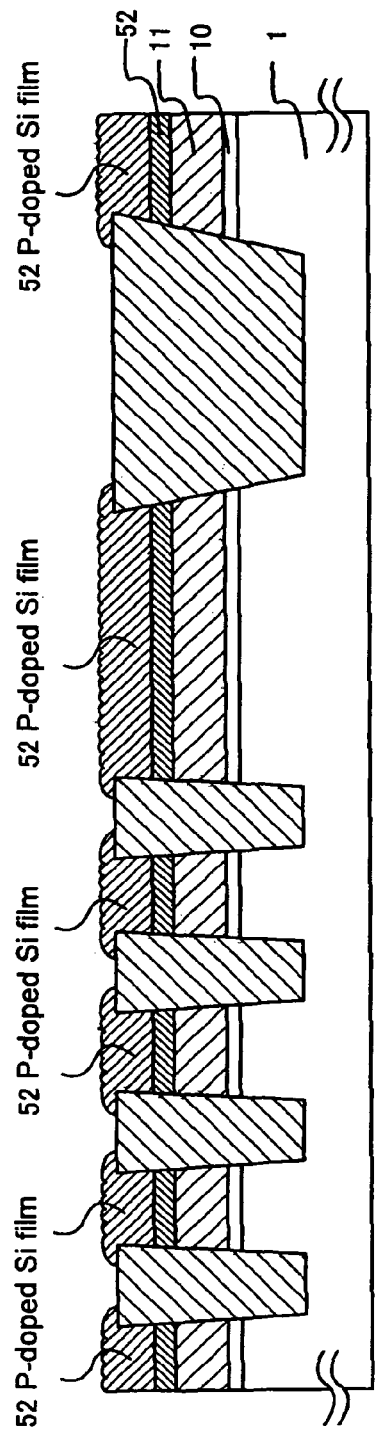

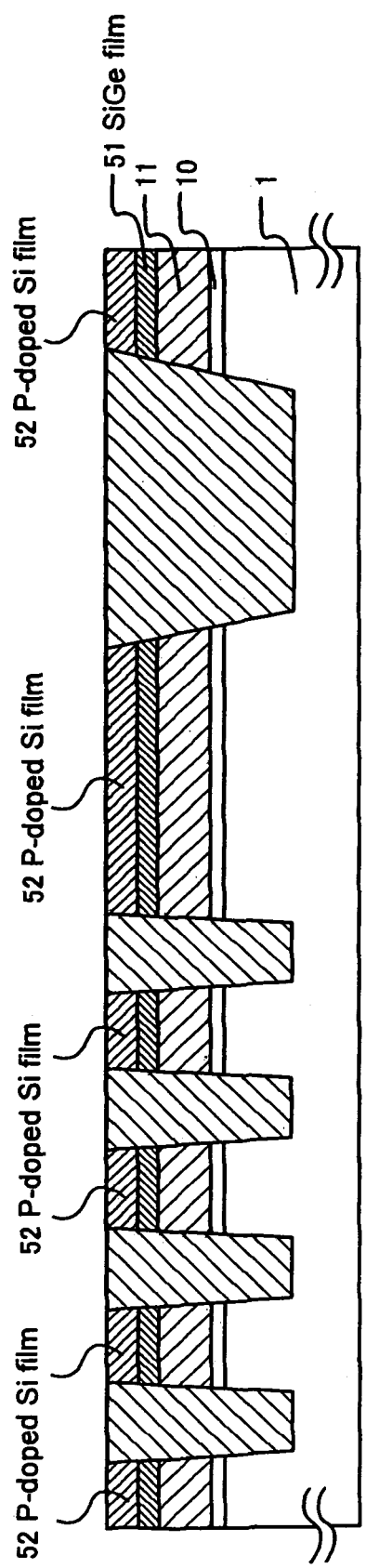

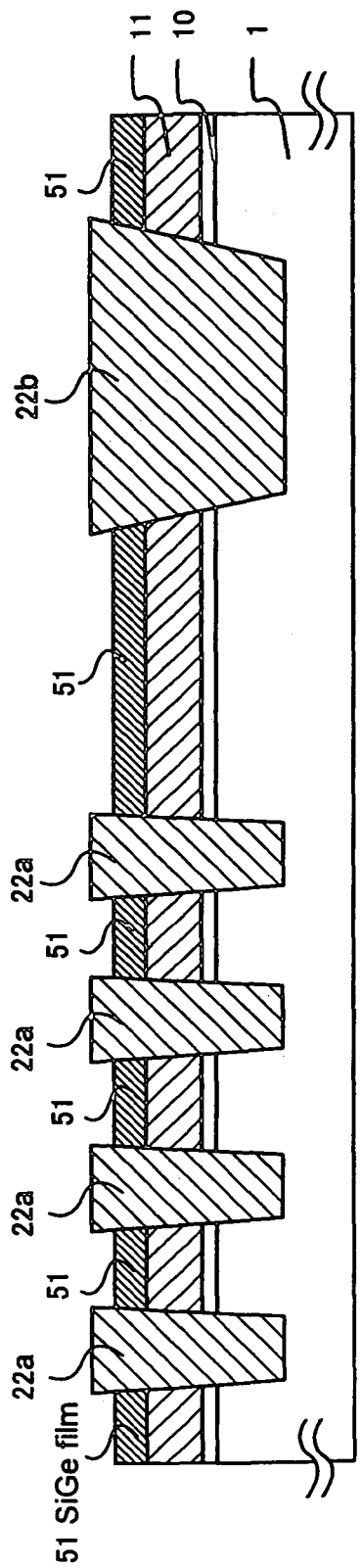
Fig.20(f-3)
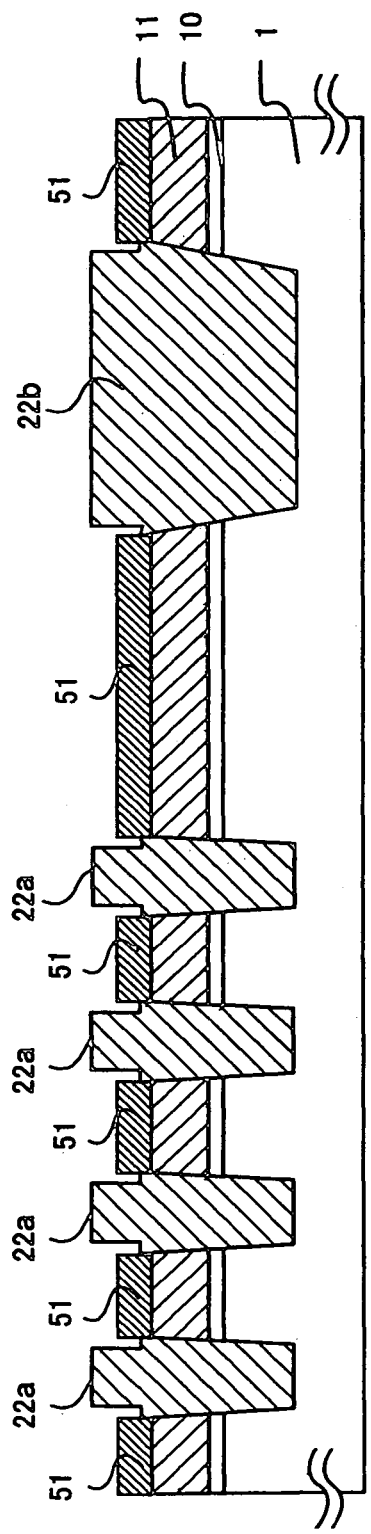
Fig.20(f-5)

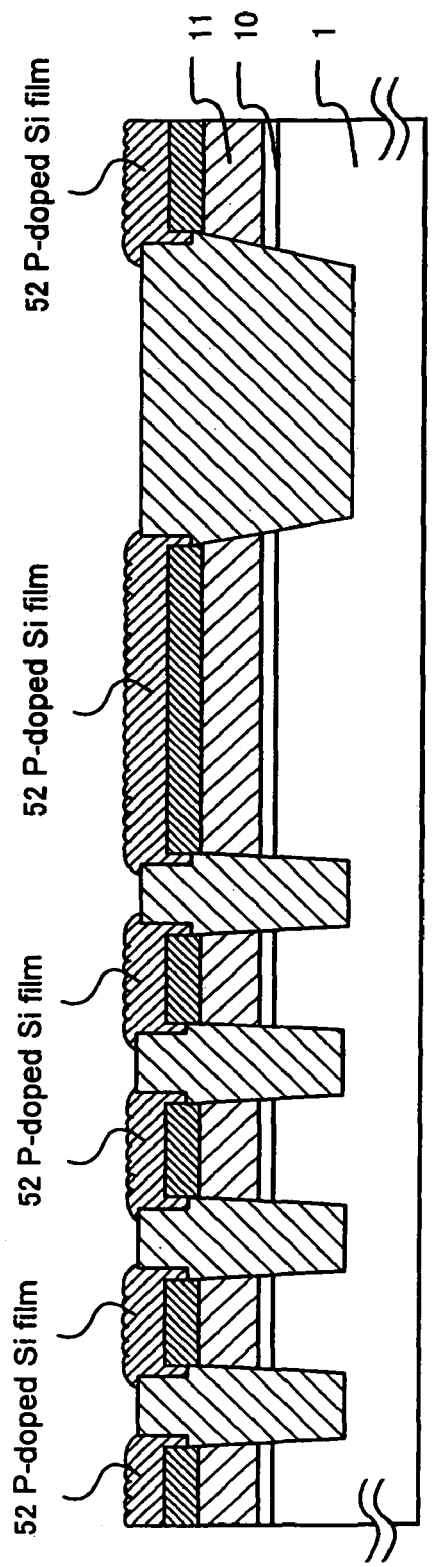
Fig.21(f-6)
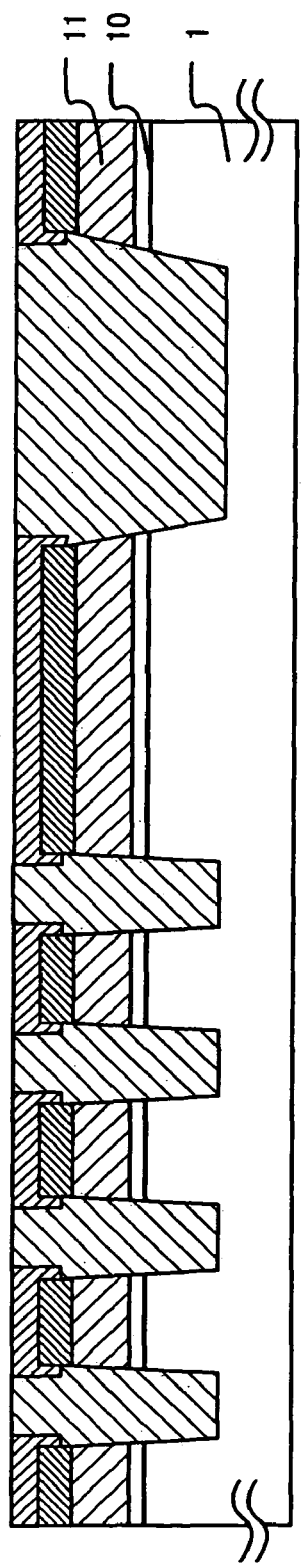
Fig.21(g-6)

METHOD OF MANUFACTURING NON-VOLATILE SEMICONDUCTOR MEMORY

CROSS-REFERENCE TO RELATED APPLICATIONS

This application is based upon and claims the benefit of priority from the prior Japanese Patent Applications No. 2005-112478, filed on Apr. 8, 2005, the entire contents of which are incorporated herein by reference.

TECHNICAL FIELD

The present invention relates to a method of manufacturing a non-volatile semiconductor memory which is electrically rewritable, and in particular relates to a method of manufacturing a flash memory.

More particularly, the present invention relates to a method of manufacturing a flash memory which has floating gates comprising a film of two layers or more.

BACKGROUND OF THE INVENTION

Flash memory is widely used as a memory for multimedia card since it can hold a memory without supplying an electric power. Recently, it is expected that flash memory with large capacities will be further developed. In order to realize this larger capacity, flash memory needs to be further integrated on a large-scale.

One of the methods of large scale integration of flash memory is disclosed in the Japanese Patent Application No. 2001-118944 and Japanese Patent Application No. 2004-55617. In this method, a silicon layer of floating gates is divided into two layers, which are deposited. First, an initial silicon layer is formed and isolation is then performed. Subsequently, for the formation of a second silicon layer, the second silicon layer is self-aligned and selectively deposited on only the first silicon layer.

The methods disclosed in Japanese Patent Publication No 2001-118944 and Japanese Patent Publication No. 2004-55617 feature that the second silicon layer is laterally expanded and grown on the insulating film for isolation to form the floating gates. These methods allow the floating gate to be wider than a tunnel insulating film and the distance between adjacent floating gates to be less than the minimum feature size. As a result, a large coupling ratio can be realized.

In addition, these methods allow a floating gate end to inevitably have a round structure, thereby crowding of the electric field can be suppressed.

In addition, one of the methods for large scale integration of flash memory is disclosed in the Japanese Patent Publication No. 2001-284556. In this method, after the tunnel gate insulating film is first formed, isolation process is performed. Next, the floating gate is formed.

BRIEF SUMMARY OF THE INVENTION

In the present invention, variation in the coupling ratio by cells is suppressed. As a result, this allows a method of manufacturing a non-volatile semiconductor memory such as a high reliability-large scale integratable flash memory to be realized.

According to one embodiment of the present invention, in a method of manufacturing a non-volatile semiconductor memory, the steps consist of forming a plurality of first semiconductor portions over a substrate, selectively growing a plurality of second semiconductor portions in contacting with the plurality of first semiconductor portions respectively, partially removing the plurality of second semiconductor portions to prepare a plurality of floating gates having substantially flat surfaces, forming insulating layers over the plurality of floating gates, and forming control gates over the insulating layers.

According to the method of manufacturing a non-volatile semiconductor memory of one embodiment in the present invention allows variation in the coupling ratio among the cells to be suppressed.

As a result, a highly reliable and highly integrated flash memory can be realized.

BRIEF DESCRIPTION OF THE DRAWINGS

FIG. 2 is a view showing a process of manufacturing a non-volatile semiconductor memory of one embodiment in the present invention;

FIG. 7 is a view showing a process of manufacturing a non-volatile semiconductor memory of one embodiment in the present invention;

FIG. 8 is a view showing a process of manufacturing a non-volatile semiconductor memory of one embodiment in the present invention;

FIG. 9 is a view showing a process of manufacturing a non-volatile semiconductor memory of one embodiment in the present invention;

FIG. 10 is a view showing a process of manufacturing a non-volatile semiconductor memory of one embodiment in the present invention;

FIG. 11 is a view showing a process of manufacturing a non-volatile semiconductor memory of one embodiment in the present invention;

FIG. 12 is a view showing a process of manufacturing a non-volatile semiconductor memory of one embodiment in the present invention;

FIG. 13 is a view showing a process of manufacturing a non-volatile semiconductor memory of one embodiment in the present invention;

FIG. 14 is a view showing a process of manufacturing a non-volatile semiconductor memory of one embodiment in the present invention;

FIG. 15 is a view showing a process of manufacturing a non-volatile semiconductor memory of one embodiment in the present invention;

FIG. 16 is a view showing a process of manufacturing a non-volatile semiconductor memory of one embodiment in the present invention;

FIG. 17 is a view showing a process of manufacturing a non-volatile semiconductor memory of one embodiment in the present invention;

FIG. 18 is a view showing a process of manufacturing a non-volatile semiconductor memory of one embodiment in the present invention;

FIG. 19 is a view showing a process of manufacturing a non-volatile semiconductor memory of one embodiment in the present invention;

FIG. 20 is a view showing a process of manufacturing a non-volatile semiconductor memory of one embodiment in the present invention;

FIG. 21 is a view showing a process of manufacturing a non-volatile semiconductor memory of one embodiment in the present invention.

DETAILED DESCRIPTION OF THE INVENTIONS

In the method disclosed in the Japanese Patent Publication Nos. 2001-118944 and 2004-55617, the surface of the selectively deposited silicon is rough, because the material is polycrystalline. This roughness causes the variation of the areas of interpoly silicon insulating films by each cell. Therefore, this method also caused the variation in the coupling ratio by cells.

In addition, these methods indicate a trade-off relation between the size of the coupling ratio and the floating gate distance. Therefore, larger coupling ratios are hardly taken as the density of the cells increases. For that reason, an increase in the coupling ratio cannot be easily realized with these methods.

In addition, if the method disclosed in the Japanese Patent Publication No. 2001-284556 is used, a cavity is formed in a second polycrystalline silicon layer used for the floating gate accompanied with the shrinkage of a memory cell. Therefore, using this method, a high quality-memory cell could not be manufactured. To remove the cavity in the second polycrystalline silicon layer, the edges of an oxide film layer might be rounded by etching. Or, after the second polycrystalline silicon layer is deposited and the second polycrystalline silicon layer is etched, a third polycrystalline silicon layer is then deposited. However, both these methods lengthened the process sequence and were complicated. In addition, conventionally, the heights of the second polycrystalline silicon layer and isolation regions were made even by etching and removing the surface of the second polycrystalline silicon layer after the second polycrystalline silicon layer was deposited. However, it is difficult to completely remove the polycrystalline silicon layer deposited on the isolation region with larger area by this process. Therefore, the process had the problem that the adjacent floating gates were short-circuited by the mutually adjacent memory cells. Further, if the method disclosed in the Japanese Patent Publication No. 2001-284556 is used, crowding of the electric field was likely to occur in the floating gates during the device operation because the edge met by the side and upper end of the floating gate is acute. Therefore, the device characteristics easily deteriorated using this method.

Next, the method of manufacturing the non-volatile semiconductor memory is explained in detail with reference to the drawings. In addition, the below-mentioned embodiments merely show examples of the method of manufacturing the non-volatile semiconductor memory in the present invention, and the methods of manufacturing the non-volatile semiconductor memory in the present invention are not limited to these embodiments.

Embodiment 1

FIG. 1 to FIG. 6 are referenced. The processes of manufacturing the non-volatile semiconductor memory of the embodiments are shown in FIG. 1 to FIG. 6.

Figure 1A:
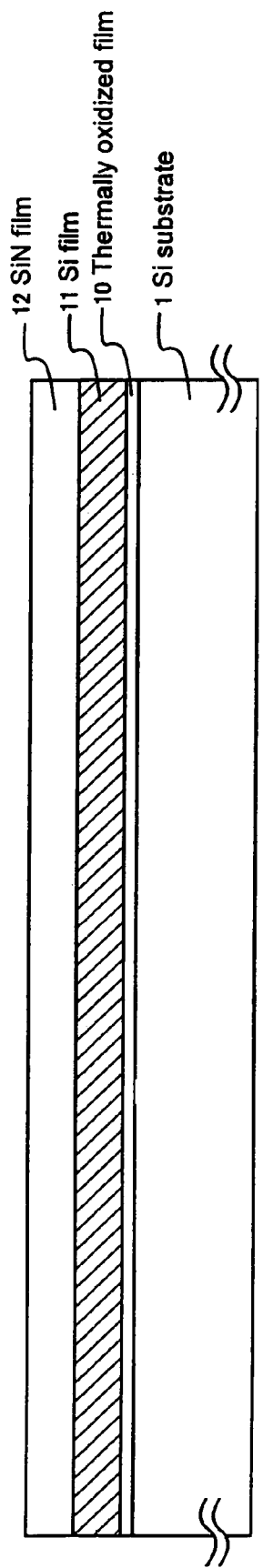
FIG. 1 is a view showing a process of manufacturing a non-volatile semiconductor memory of one embodiment in the present invention.

FIG. 1 is referenced. As shown in FIG. 1(a), the thermally oxidized insulating film 10 of thickness 9 nm that was to be the tunnel insulating film was formed as a first insulating film over the silicon substrate 1. Afterwards, the first semiconductor portion (Si film) was formed at a thickness of 40 nm. Subsequently, as a second insulating film, for example, the silicon nitride film (SiN film) 12 was formed at a thickness of 150 nm. In addition, phosphorus may be or may not be doped in the first semiconductor portion (Si film) 11. In addition, the first semiconductor portion (Si film) may be formed of amorphous silicon or polycrystalline silicon. If the first semiconductor portion (Si film) is formed of amorphous silicon, there surface is relatively flat. Therefore, fluctuation of the structure can be reduced in the post processes such as Line Edge Roughness (LER) because the surface of the second insulating film 12 formed on the surface thereof can also be flattened. On the other hand, if the first semiconductor portion (Si film) 11 is formed of polycrystalline silicon, it is possible to perform high-precision processing in the post processes because the density thereof is larger than that of amorphous silicon. In addition, even if the first semiconductor portion (Si film) 11 is formed of amorphous silicon, the amorphous silicon is crystallized in a thermal process when a SiN film that is the second insulating film 12 is deposited and is converted into a polycrystalline silicon film.

Figure 1B:
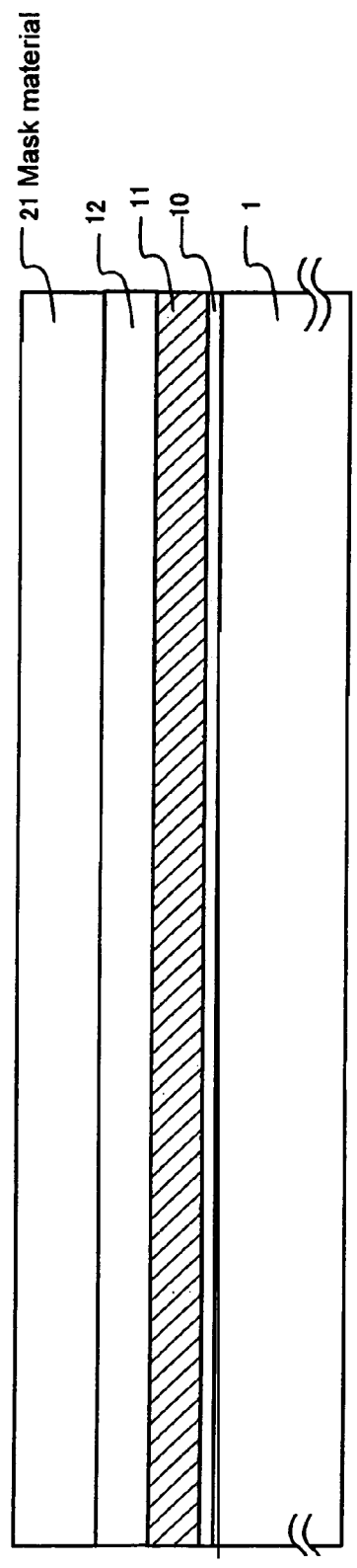
Figure 3A:
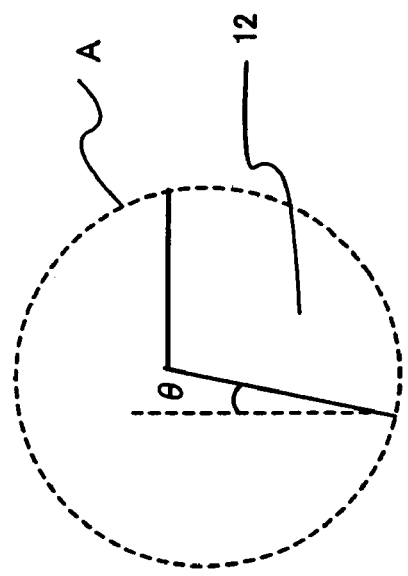
FIG. 3(*a*) is an enlarged view of the portion shown in "A" in FIG. 2(*c*) and FIG. 3(*b*) is a view showing the conditions in which a granular silicon film is formed on isolation regions a, b.

Next, as shown in FIG. 1(b), the mask material 21 was deposited. Afterwards, as shown in FIG. 2(c), patterning was performed, the SiN film 12 that is the second insulating film, the first semiconductor portion (Si film) 11, the first insulating film 10, and the silicon substrate 1 were etched and removed by performing Reactive Ion Etching (RIE) to form the portions that were to be the isolation regions a, b. The isolation regions a and b were the deactivated areas, and an area other than the areas functioning as a transistor were to be the active areas. Here, the enlarged view of the portion shown "A" in FIG. 2(c) is shown in FIG. 3(a). In the process shown in FIG. 2(c), to improve the filling characteristics of the insulating layers for isolation in the next process, the second insulating film (SiN film) 12 and the silicon substrate 1 may be inversely tapered with a taper angle (Theta θ) of 0.3-5 [degrees], typically about 3 [degrees].

Next, as shown in FIG. 2(d), after the mask material 21 was removed, the insulating layers 22a and 22b for isolation were filled in the isolation regions a and b. Afterwards, the upper portions of the insulating layers 22a and 22b for isolation were etched off by polishing techniques such as Chemical Mechanical Polish (CMP) with the second insulating film (SiN film) 12 as a stopper or methods such as etch-back to make even the heights of the surfaces of the second insulating film (SiN film) 12 and the insulating layers 22a and 22b for isolation. CMP was used in the embodiment. Particularly, it is advantageous that the use of CMP as a polishing technique allows variation between cells to be reduced because the surface is smoothed after polishing and the height of the stopper and the polished surface can be made even. In this case, a so-called dishing may occur because the surfaces of the insulating layers for isolation are excessively ground. The larger the area of the isolation regions the greater the dishing appears. In addition, the second insulating film (SiN film) 12 is also ground by about 10 nm in the process shown in FIG. 2 (*d*).

Figure 4E:
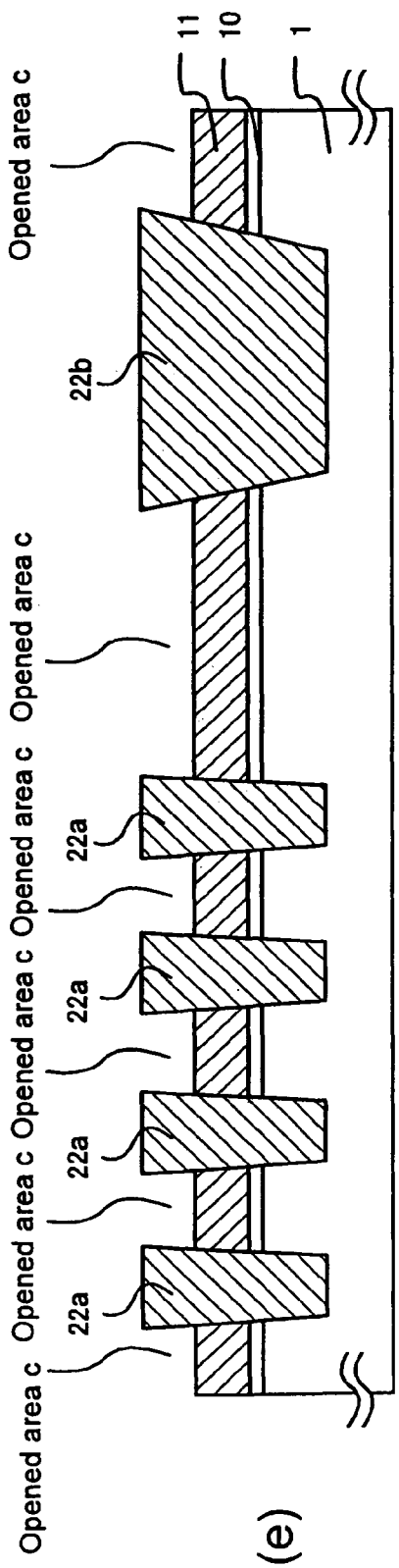
FIG. 4 is a view showing a process of manufacturing a non-volatile semiconductor memory of one embodiment in the present invention.
Figure 4F:
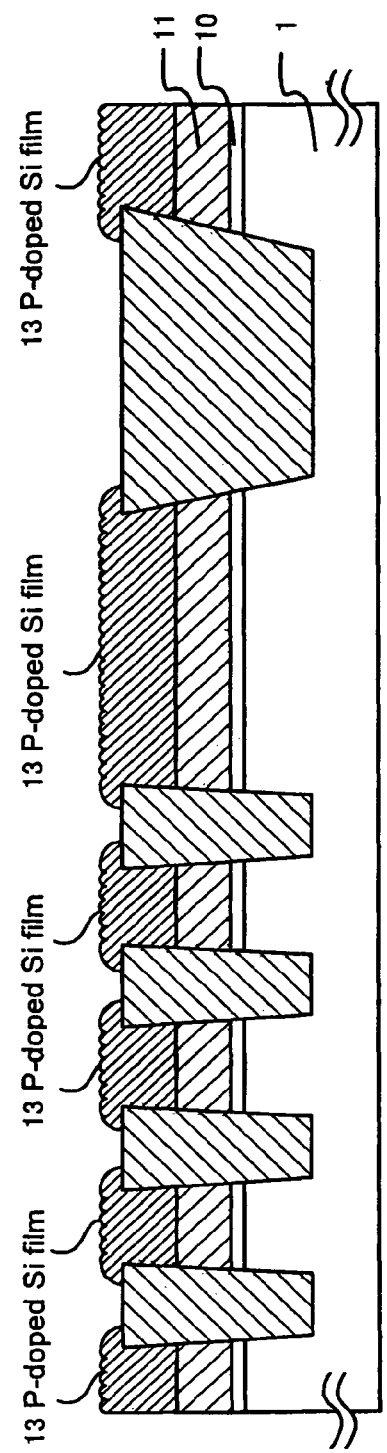

Next, as shown in FIG. 4 (*e*), the second insulating film (SiN film) 12 was removed by phosphorus acid wet etching. If the isolation regions a and b are inversely tapered (typically θ=about 3 [degrees]), the opened area c that is the portion from which the second insulating film (SiN film) 12 is removed is tapered. In addition, the depth of the opened area c was 140 nm which was the same as the thickness of the second insulating layer (SiN film) 12.

Next, etching processing is performed with DHF (dilute hydrofluoric acid) solution to remove (a natural) oxide film formed on the surface of the first semiconductor portion (Si film) 11. A silicon crystal appeared on the surface of the first semiconductor portion (Si film) by the oxide film removal process.

Figure 3B:
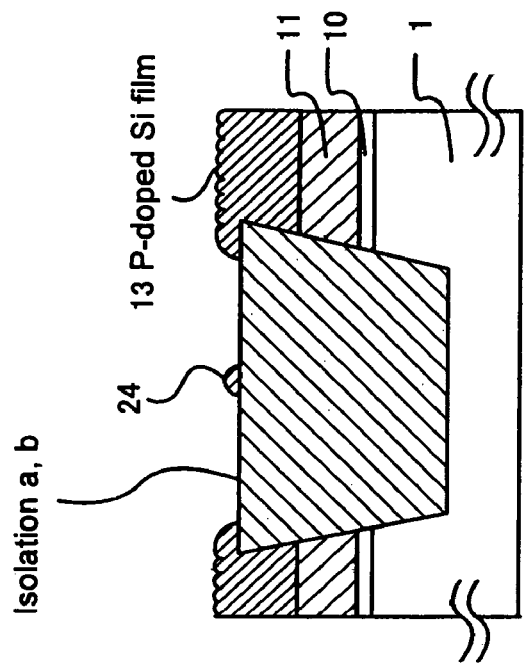

Next, a phosphorus-doped silicon film (P-doped Si film) 13 was deposited by using Low Pressure Chemical Vapor Deposition (LPCVD). Dichlorsilane (DCS), hydrogen chloride (HCl), and phosphine ($PH_3$) were supplied onto the surface of the substrate as precursors, a phosphorus-doped silicon film (P-doped Si film) 13 was deposited at a thickness of 160 nm as a second semiconductor portion in the opened area c as shown in FIG. 4 (*f*). In the deposition, hydrogen ($H_2$) or nitrogen ($N_2$) may be used as a carrier gas. At the time of the deposition of the second semiconductor portion 13, the substrate temperature was 800° C., the pressure was 10 Torr (1333.22 Pa), the flow rates of DCS, HCl, and DCS were each 0.5 slm (slm: standard liter/min, $0.5 \times 10^{-3}$ $m^3$/min), 0.1 slm (slm: standard liter/min, $0.1 \times 10^{-3}$ $m^3$/min), and 0.002 slm (slm: standard liter/min, $0.002 \times 10^{-3}$ $m^3$/min). In addition, the deposition rate was 4 nm/min. The second semiconductor portion 13 was deposited as polycrystalline silicon where the phosphorus concentration was $2 \times 120$ $cm^{-3}$ in the film. In case of this deposition conditions, no silicon was deposited over the upper surfaces of the insulating layers 22a and 22b for isolation except for the overgrowth grown onto the insulating layers for isolation in a border area between the insulating layers 22a and 22b for isolation and the opened area c. On the other hand, if the HCl flow rate was determined to be 0.05 slm (slm: standard liter/min, $0.05 \times 10^{-3}$ $m^3$/min), the deposition rate was increased to 10 nm/min. However, a granular silicon film 24 was deposited over the upper surfaces of the insulating layers 22a and 22b for isolation as shown in FIG. 3 (*b*). In addition, the second semiconductor portion 13 may be formed of a silicon-germanium film by further doping monogermane ($GeH_4$) in the deposition of the second semiconductor portion 13. This example will be described in detail in the embodiment later described.

In addition, if the opened area c is tapered, the area of the lower surface in the second semiconductor portion 13 is larger than that of the upper surface thereof.

Figure 5G:
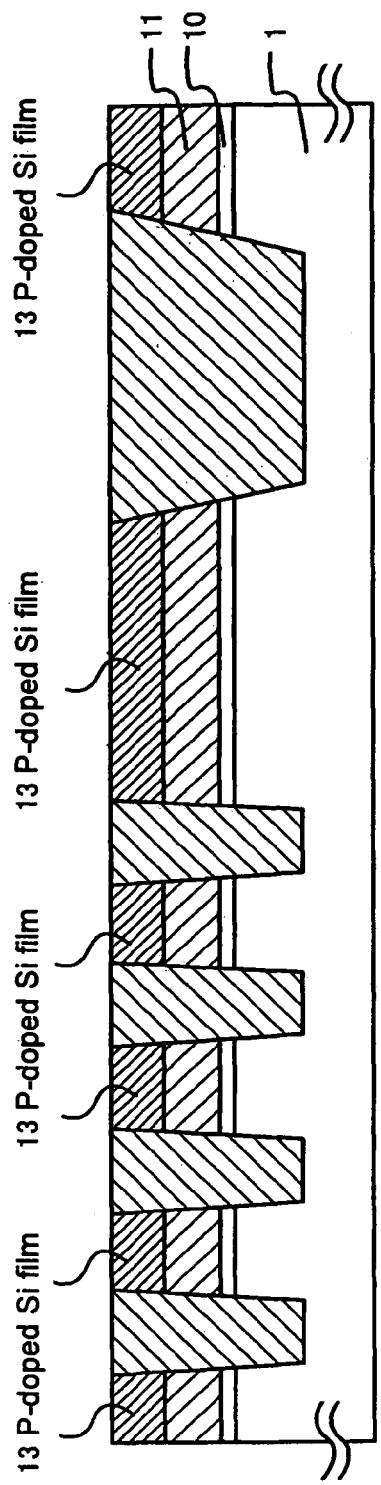
FIG. 5 is a view showing a process of manufacturing a non-volatile semiconductor memory of one embodiment in the present invention.
Figure 5H:
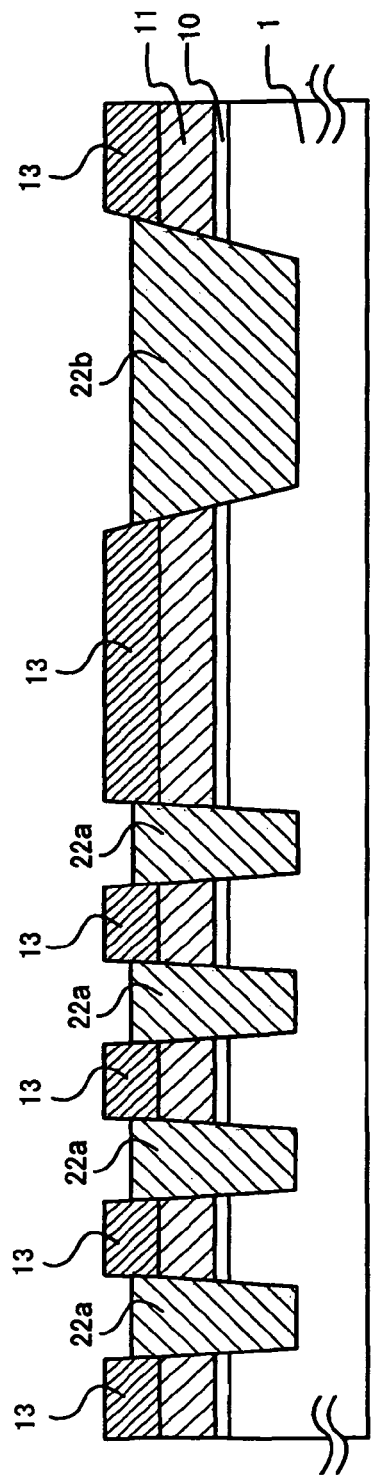

Next, a part of the second semiconductor portion 13 was removed so as to allow the same to be flattened by polishing technique such as CMP or surface smoothing processing such as etch-back as shown in FIG. 5 (*g*). This process allows the rough surface of the second semiconductor 13 to be flattened. This allows the surface shapes of the second semiconductor portion 13 which differ by memory cells to be equalized. Particularly, that using CMP as a polishing technique allows the dielectric property of the insulating layer formed on the upper portion thereof to be improved and fluctuation in dielectric property between cells to be reduced because the surface after polishing can be smoothed and the height of the stopper and the polished surface can be equalized. In addition, even if the silicon island 24 is already grown on the insulating layers 22a and 22b for isolation by the process, the island can be simultaneously removed. In addition, even if the second semiconductor portion 13 is already grown over the insulating layers 22a and 22b for isolation, the short-circuit of adjacent second semiconductor portions 13 (floating gates) can be prevented and no defect in electrical characteristics occurs because the second semiconductor portion can be removed.

Next, the insulating layers 22a and 22b for isolation were removed by about 100 nm by Reactive Ion Etching as shown in FIG. 5 (*h*). Afterwards, etching may be performed on only the edges of the second semiconductor portion 13 by Chemical Dry Etching to increase the radius of curvature of the edges thereof. In addition, the radius of curvature may be increased by, for example, methods such as oxidization instead of performing etching on the edges. In the embodiment, the radius of curvature of the roundness in the edges of the second semiconductor portion 13 was 500 nm. Using the shape in the second semiconductor portion 13 in the embodiment allows electric field during the device operation to be reduced, thereby enabling the system to realize stable operation of the memory cells.

Figure 6I:
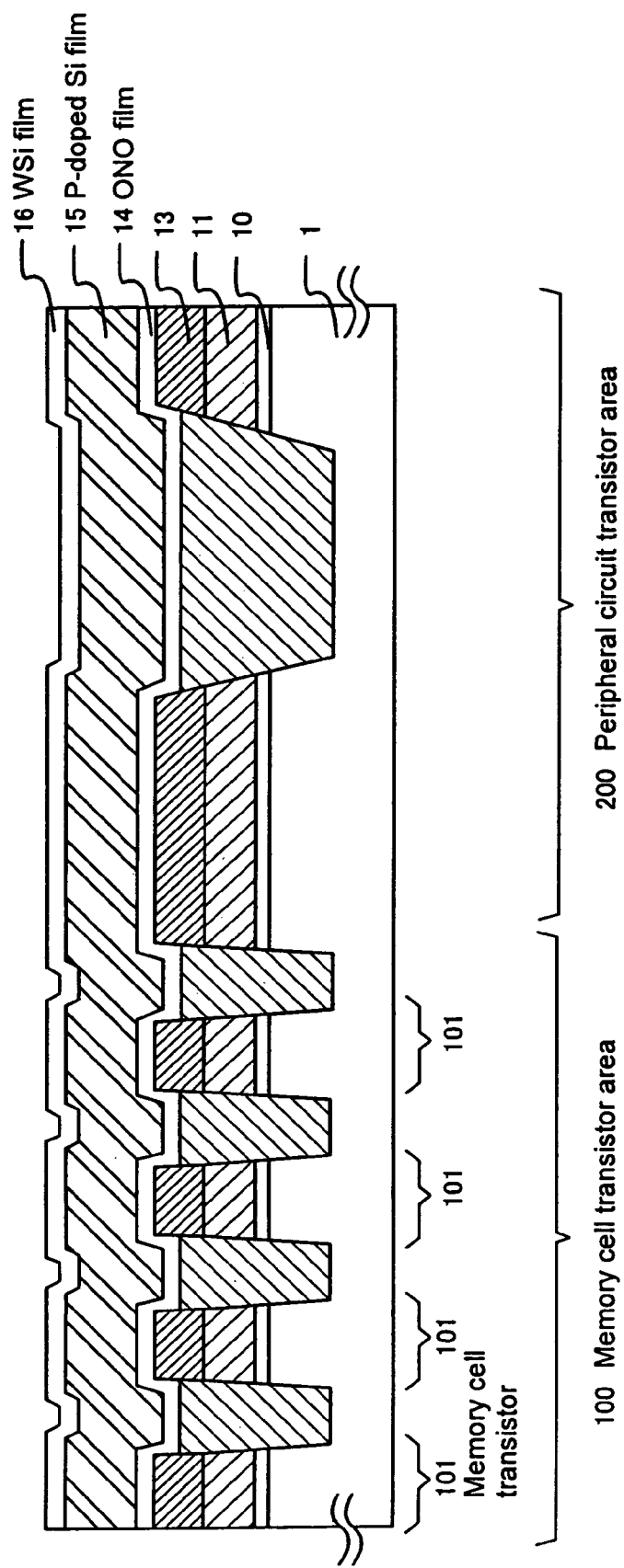
FIG. 6 is a view showing a process of manufacturing a non-volatile semiconductor memory of one embodiment in the present invention.

Next, the insulating layer (interpolysilicon insulating film) 14 was formed between the floating gate comprising the first semiconductor portion 11 and the second semiconductor portion 13 and the control gate later formed as shown in FIG. 6 (*i*). As the insulating layer 14, a so-called ONO film comprising silicon oxide film/silicon nitride film/silicon oxide film or a so-called high dielectric insulating layer having a dielectric constant higher than that of silicon oxide film is used.

Next, a phosphorus-doped silicon film (P-doped Si film) 15 was formed at a thickness of 100 nm, subsequently, a tungsten silicide film (WSi film) 16 was formed at a thickness of 100 nm. The silicon film 15 and tungsten silicide film 16 are each determined to be control gates.

Next, the floating gates were isolated by memory cell. Alternatively Reactive Ion Etching for patterning the silicon film 15 and the tungsten silicide film 16 for the control gate was performed (not shown).

The memory cell 101 is formed in a memory cell transistor area 100 by the foregoing processes. In addition, elements for forming a circuit to control the memory cell transistor 101, and the like, are formed in the peripheral circuit transistor area 200.

Figure 22:
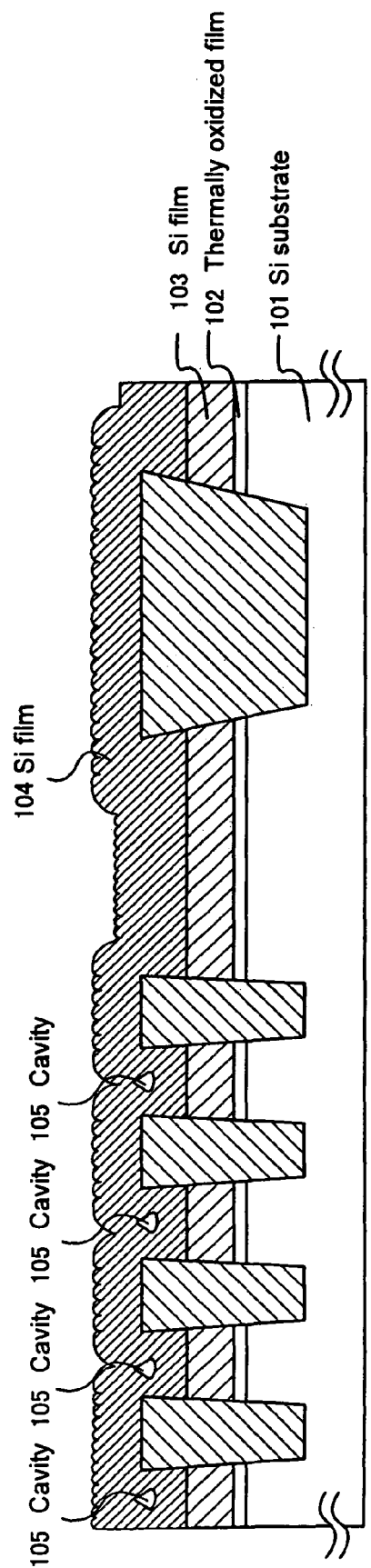
FIG. 22 shows a condition in which a cavity 105 is formed in a second semiconductor portion 104 on a semiconductor portion 103 at the central portion of each memory cell.

The method of manufacturing the non-volatile semiconductor memory of the embodiment has the following features:

In the method of manufacturing the non-volatile semiconductor memory of the embodiment, the second semiconductor portion 13 is formed by selective growth with the first semiconductor portion 11 as a seed. On the other hand, conventionally, the second semiconductor portion was nonselectively grown. Thus, if the second semiconductor portion was nonselectively grown, particularly, if a trench was formed so as to be inversely tapered and as a result, the second semiconductor portion 13 was deposited in the opened area c like a tapered groove, the cavities 105 were inevitably formed in the semiconductor portion 104 on the first semiconductor portion 103 at the central portion in each memory cell as shown in FIG. 22. If such cavities 105 are formed, the cavity 105 is exposed on the surface, which may cause a possible electrical defect of the interpolysilicon insulating film later formed when the second semiconductor portion 104 is flattened. However, in the method of manufacturing a non-volatile semiconductor memory of the embodiment, such cavities are formed because the second semiconductor portion 13 is formed by selective growth with the first semiconductor portion 11 as a seed.

In addition, if the second semiconductor portion 13 is deposited with a sufficient selectivity, the formation of a silicon film can be suppressed on the insulating layers 22a and 22b for isolation, eliminating the possibility that the floating gates are mutually short-circuited. Even if an insufficient selectivity is provided when the second semiconductor portion 13 is formed, the silicon island can be more easily removed than a conventional technique by processing the portion by polishing techniques such as CMP or etch-back or the like because the silicon film 24 formed on the insulating layers 22a and 22b for isolation is granular.

In addition, by selectively depositing the second semiconductor portion 13 with impurity doped, this allows the impurity concentration of the floating gate to be high, thereby enabling the floating gate to suppress the depletion of the tunnel insulating film 10 and the interpolysilicon insulating film 14.

Conventionally, if the floating gate was formed by a two-layer silicon layer, the second semiconductor portion was grown without a selective growth. If the second semiconductor portion is grown without the selective growth, because phosphorus of high concentration is doped in the silicon film, the deposition by alternately supplying $SiH_4$ and $PH_3$ under a pressure of about 0.1 Torr (13.3322 Pa) is used in many cases. However, in this method, because the second semiconductor portion is formed inside the groove portion (opened portion), the width of an internal portion in the groove when phosphorus is adsorbed is narrower than that of the original groove. Therefore, it is difficult to increase the average concentration of phosphorus in the film. On the contrary, according to the method of manufacturing the non-volatile semiconductor memory of the embodiment, because the second semiconductor portion is selectively grown, it is possible to deposit the second semiconductor portion under a relatively high pressure of 10 Torr (1333.22 Pa). As a result, the deposition rate is not low and the silicon film containing phosphorus of a high concentration can be formed in the opened portion (inside the groove) even if $PH_3$ is simultaneously supplied together with a silicon source gas (for example, dichlorsilane (DCS: $SiH_2Cl_2$)

In addition, particularly, in a conventional depositing method that the alternate supply of $SiH_4$ and $PH_3$ is repeated, to sufficiently supply phosphorus even in the groove, a thermal process for sufficiently diffusing phosphorus in the film was required as a process prior to the process that the second semiconductor portion was processed by polishing techniques such as CMP. On the other hand, according to the method of manufacturing the non-volatile semiconductor memory of the embodiment, because phosphorus is originally evenly doped in the semiconductor portion 13, the thermal process for diffusing phosphorus is not required as a process prior to the process that the second semiconductor portion is processed by CMP or the like.

In addition, according to the method of manufacturing the non-volatile semiconductor memory of the embodiment, the elimination of phosphorus from the first semiconductor portion 11 and/or the second semiconductor portion 13 caused by the external diffusion of phosphorus can be suppressed by allowing a gas containing phosphorus to flow when the second semiconductor portion 13 is deposited.

In addition, although explained in detail in the embodiment later described, if the second semiconductor portion 13 is determined to be formed of a silicon germanium, it is hardly grown over the insulating layers 22a and 22b for isolation at the time of the selective growth. As a result, a high speed selective growth is possible at a low temperature, which can work advantageously for the realization of a process at a lower temperature. In addition, if the second semiconductor portion 13 is determined to be formed of the silicon germanium film, the germanium composition can be changed in an area contacting the tunnel insulating film 10 and an area contacting the interpolysilicon insulating film 14 inside the floating gate. Because the band gap of silicon germanium is narrower than that of silicon, a current flow in the tunnel insulating film 10 in which the current should be allowed to flow at the time of data write/erase can be sufficiently secured while reducing the current flow in the interpolysilicon insulating film 14 in which current leakage should be suppressed.

In addition, the second semiconductor portion 13 formed by a selective growth as shown in FIG. 4 (f) is grown as polycrystalline silicon on the first semiconductor portion 11 which is also polycrystallne as a seed. Therefore, the preferred orientation of the second semiconductor portion 13 is similar to the preferred orientation of the first semiconductor portion 11, typically the preferred orientation of columnar structure. Namely, the grain boundary of the second semiconductor is preferentially directed in one direction in a longitudinal direction (in an almost vertical direction to a substrate) Generally, diffusion though grain boundary is likely to occur in a polycrystalline silicon. Therefore, if the second semiconductor 13 is a polycrystalline silicon having a columnar structure, a dopant in the second semiconductor portion 13 can be efficiently supplied and diffused into the first semiconductor portion 11. Therefore, phosphorus can be sufficiently diffused in the vicinity of the tunnel insulating film 10, and depletion can be suppressed in the floating gate contacting the tunnel insulating film 10. For that reason, the tunnel insulating film 10 is able to be thinned further. On the other hand, if the second semiconductor portion is not formed by the selective growth and a polycrystalline silicon is formed by the non-selective growth as in a conventional method, efficient impurity diffusion by the method of manufacturing of the embodiment would not occur because some of the grain boundaries are parallel to the substrate.

In addition, to secure the filling property of the insulating layers for isolation 22a and 22b, in the method of manufacturing the non-volatile semiconductor memory of the embodiment, the groove for isolation region may be inversely tapered. If the groove for isolation is inversely tapered like this, the opened area that forms the second semiconductor portion 13 is inevitably tapered, and a cavity is inevitably produced in an area that is to be the floating gate of the second semiconductor portion 13 if the second semiconductor portion 13 is deposited with the non-selective condition. On the other hand, in the method of manufacturing the non-volatile semiconductor memory of the embodiment, this problem never occurs because the second semiconductor portion 13 is selectively grown. By adopting such a taper structure, Reactive Etching Process that isolates the floating gates by floating gate can be done without any amount of the silicon left. As a result, the method has an effect that a defect such as the floating gates electrically short-circuit hardly occurs.

In addition, according to the method of manufacturing the non-volatile semiconductor memory of the embodiment, by forming the interpolysilicon insulating layer 14 after the insulating layers 22aq and 22b for isolation are lessened by etching, the method exerts an excellent effect that the coupling ratios can be evenly determined at arbitrarily high values by the reduced amount independent of the chip design without using the lateral overgrowth of the second semiconductor 13.

In addition, in the method of manufacturing the non-volatile semiconductor memory of the embodiment, it is also possible to execute the invention by suitably combining the processes explained in the embodiments 2 to 8 below.

Embodiment 2

In this embodiment, it is explained an example using a so-called intrinsic second semiconductor portion (polycrystalline silicon film) where dopants are not intentionally introduced, instead of the second semiconductor portion 13 to which phosphorus in the embodiment 1 is doped is explained. In the method of manufacturing the non-volatile semiconductor memory of the embodiment, the processes shown in FIG. 1 (*a*) to FIG. 4 (*e*) are not explained again here because they are the same processes as in the processes explained in the first embodiment.

Refer to FIG. 7. The substrate is transferred to the depositing tool for LPCVD (not illustrated). Dichlorsilane (DCS) and hydrogen chloride (HCl) were supplied onto the surface of the substrate as precursors, and the so-called intrinsic second semiconductor potion (Si film) 13' where a dopant was not intentionally introduced in the opened area c was deposited at a thickness of 160 nm as shown in FIG. 7 (*f*-1). At the time of depositing the second semiconductor portion 13', the substrate temperature was 800° C., the pressure was 10 Torr (1333.22 Pa), the flow rates of DCS and HCl were each 0.5 μm (slm: standard liter/min, $0.5 \times 10^{-3}$ m³/min) and 0.1 slm (slm: standard liter/min, $0.1 \times 10^{-3}$ m³/min). In addition, the deposition rate was 5 nm/min.

The second semiconductor portion was deposited as polycrystalline silicon where the dopant concentration in the film was $1 \times 10^{19}$ cm⁻³ or less. In case of this deposition condition, silicon was not deposited over the upper surface of the insulating layers 22*a* and 22*b* for isolation. On the other hand, if the HCl flow rate was determined to be 0.05 slm (slm: standard liter/min, $0.05 \times 10^{-3}$ m³/min), the deposition rate was increased to 12 nm/min. However, the second silicon island 24 was deposited on the upper surface of the insulating layers 22*a* and 22*b* for isolation similarly as shown FIG. 3 (*b*).

Next, phosphorus ion was implanted into the second semiconductor portion 13' as shown in FIG. 7 (*f*-2). Afterwards, the second semiconductor portion 13' grown on the insulating layers 22*a* and 22*b* for isolation were removed by polishing technique such as CMP or surface smoothing processing such as etch-back as shown in FIG. 8 (*g*-1). CMP was used in the embodiment. This processing allows the second semiconductor portion 13' with rough surface to be smoothened. This allows the surface shapes of the second semiconductor portion 13' which differ by memory cell to be equalized. In addition, the second semiconductor potion 13' can be removed by the processing even if the second semiconductor portion 13' is already grown over the insulating layers 22*a* and 22*b* for isolation. Therefore, defects in electrical characteristics never occur because the short-circuiting of adjacent second semiconductor portions 13' (floating gates) can be prevented.

In addition, thermal processing may be performed in a gas containing a dopant instead of the process of implanting a phosphorus ion as shown in FIG. 7 (*f*-2). For example, thermal processing is performed on the substrate in a PH₃ or AsH₃ ambient diluted with an inert gas or hydrogen. Thermal processing may be performed continuously with the deposition of the intrinsic second semiconductor portion 13'. The dopants are introduced into the second semiconductor portion 13' by thermal processing. After this step, the second semiconductor portion 13' overgrown on the insulating layers 22*a* and 22*b* for isolation is removed by the process shown in FIG. 8 (*g*-1).

The doping by thermal processing in the gas containing the dopant is called Gas Phase Doping (hereinafter referred to as "GPD"), the method avoids the problem of a decline in growth rate taking place if the doping is simultaneously performed with the deposition. On the other hand, generally, a conventional technique causes a polycrystalline silicon flow occurs to roughen the surface because thermal processing is performed in a reduced pressure if GPD is performed on polycrystalline silicon. However, according to the non-volatile semiconductor memory and the method of manufacturing the same of the embodiment, the removal of the surface of the second silicon film 13' by GPD can be performed by the process that removes the second silicon film 13' overgrown over the insulating layers 22*a* and 22*b* for isolation shown in FIG. 8 (*g*-1) after GPD is performed.

Next, the substrate is transferred to the depositing tool for LPCVD. Dichlorsilane (DCS) and hydrogen chloride (HCl) were supplied onto the surface of the substrate as the precursors, and the so-called intrinsic second semiconductor portion (Si film) 13' where the dopant was not intentionally introduced in the opened area c was deposited at a thickness of 160 nm as shown in FIG. 9 (*f*-1) Afterwards, the second semiconductor portion 13' grown on the insulating layers 22*a* and 22*b* for isolation may be removed by a polishing technique such as CMP or surface smoothing processing such as etch-back as shown in FIG. 9 (*f*-2). Afterwards, phosphorus ion may be implanted into the second semiconductor portion 13' as shown in FIG. 10 (*g*-3).

In any of the foregoing cases in the embodiment, the subsequent processes are the same as in the first embodiment.

According to the embodiment, phosphorus ion can be introduced into the second semiconductor portion 13' by ion implantation or GPD after the second semiconductor portion 13' is formed even if the phosphorus doped second semiconductor portion 13' is not formed. As a result, the impurity concentration of the second semiconductor portion 13' can be accurately controlled. Variation in characteristics by cells can also be reduced. Further, a growth rate and high productivity can be obtained.

In addition, in the method of manufacturing the non-volatile semiconductor memory of the embodiment, it is also possible to execute the invention by suitably combining the first embodiment with the processes explained in the third to the eight embodiments later described.

Embodiment 3

In the embodiment, in the method of manufacturing the non-volatile semiconductor memory of the embodiment, an example that etching is performed on the Si film 12 before the insulating layers 22*a* and 22*b* for isolation are formed is explained in the method of manufacturing the non-volatile semiconductor memory in the first embodiment. In addition, in the method of manufacturing the non-volatile semiconductor memory of the embodiment, because the processes shown in FIG. 1 (*a*) to FIG. 2 (*c*) are the same processes explained in the first embodiment, they are not explained again here.

The mask material 21 was removed after the process shown in FIG. 2 (*c*), as shown in FIG. 11 (*c*-1). Afterwards, etching was performed on the Si film 12 with the heated phosphoric acid solution to thin the line width (FIG. 11 (*c*-2)). As a result, the upper portions of the isolation regions 22*a* and 22*b* were widened, as shown in FIG. 11 (*c*-2).

Next, the insulating layers 22*a* and 22*b* for isolation were deposited on the isolation regions a and b as shown in FIG. 12 (*d*-1). Afterwards, the insulating layers 22*a* and 22*b* for isolation were etched and removed by a polishing technique such as CMP or etch-back or the like with the SiN film 12 as a stopper to equalize the heights of the surfaces of the SiN film and the insulating layers 22a and 22b for isolation. In this case, a so-called dishing may occur because the surfaces of insulating layers 22a and 22b for isolation are excessively ground. The larger the isolation regions are the greater the dishing appears. In addition, the SiN film is designed to be ground by about 10 nm in the process shown in FIG. 12 (d-1). The insulating layers 22a and 22b will have widened upper portions in shape in the embodiment as shown in FIG. 12 (d-1).

Next, the SiN film 12 was removed by phosphoric acid wet etching, as shown in FIG. 12 (e-1). If the isolation regions a and b are inversely tapered (typically θ=about 3 degrees), the opened area c from which the SiN film is removed is tapered.

Next, etching process was performed with DHF solution to remove (a natural) oxide film formed on the surface of the first semiconductor portion 11. Crystalline silicon surface of the first semiconductor portion 11 appeared by the oxide film removal processing. The subsequent processes are the same as in FIG. 4 (f) to FIG. 6 (i) described in the first embodiment.

According to the method of manufacturing the non-volatile semiconductor memory of the embodiment, because the insulating layers 22a and 22b for isolation are widened beforehand by performing etching processing with the DHF solution, the widths of the insulating layers for isolation are not narrowed too much even if etching is performed with this DHF solution. This allows the issues cue to the close distance between the adjacent floating gates themselves to be avoided. As a result, the problem of interference by the proximity effect of memory cells themselves can be solved.

In addition, in the method of manufacturing the non-volatile semiconductor memory of the embodiment, it is also possible to execute the invention by suitably combining the first and the second embodiments with the processes explained in the fourth to the eight embodiments later described.

Embodiment 4

In the embodiment, the area with the surface of the first semiconductor portion exposed onto the surface is evenly prepared in an area other than the area that is to become the floating gates after the process in FIG. 4 (e) explained in the first embodiment. As a result, the second semiconductor portion 13 is selectively deposited evenly on an area other than that which is to be the floating gates. Such an area is prepared on a part of a broader insulating film area. The foregoing preparation allows the occurrence of an uncontrollable selection collapse which can be suppressed even in a broader insulating area where selection growth is likely to collapse.

In addition, in the method of manufacturing the non-volatile semiconductor memory of the embodiment, it is also possible to execute the invention by suitably combining the first to the third embodiments with the processes explain in the fifth to the eight embodiments later described.

Embodiment 5

In the embodiment, in the method of manufacturing the non-volatile semiconductor memory of the embodiment according to the present invention, the example that partially etches and removes the insulating layers 22a and 22b for isolation after the insulating layers 22a and 22b for isolation are formed and the SiN film is removed by phosphorus acid wet etching is described. In addition, in the method of manufacturing the non-volatile semiconductor memory, because the processes shown in FIG. 1 (a) to FIG. 4 (e) are the same as the processes explained in the first embodiment, they are not described again here.

The SiN film 12 was removed by phosphoric acid wet etching by the same process in FIG. 4 (e), as shown in FIG. 13 (e). If the isolation regions a and b are inversely tapered (typically θ=about 3 degrees), the opened area c that is the portion from which the SiN film 12 is removed is tapered. In addition, the depth of the opened area c was 140 nm, the same as in the SiN film 12. Here, as shown in FIG. 13 (e-1), the area for forming the second semiconductor portion is enlarged by etching and removing the insulating layers 22a and 22b for isolation with dilute fluoric acid, or the like to reduce the same amount, as shown in FIG. 13 (e-1).

Next, etching processing was performed with DHF solution to remove (a natural) oxide film formed on the surface of the first semiconductor portion. Crystalline silicon surface of the first semiconductor 11 appeared by the oxide film removal processing.

Next, the substrate was transferred to the depositing tool for LPCVD. Dichlorsilane (DCS), hydrogen chloride (HCl) and phosphine ($PH_3$) were supplied onto the surface of the substrate as the precursors, and the second semiconductor portion where phosphor was doped to the opened area c (P-doped Si film) 13 was deposited at a thickness of 160 nm, as shown in FIG. 14 (f-2). At the time of depositing the second semiconductor portion, the substrate temperature was 800° C., the pressure was 10 Torr (1333.22 Pa), the flow rates of DCS, HCl and $PH_3$ were each 0.5 s/l (s/l: standard liter/min, $0.5 \times 10^{-3}$ $m^3$/min), 0.1 slm (slm: standard liter/min, $0.1 \times 10^{-3}$ $m^3$/min) and 0.02 slm (slm: standard liter/min, $0.02 \times 10^{-3}$ $m^3$/min). In addition, the deposition rate was 4 nm/min. In case of this deposition condition, silicon was not deposited on the upper surfaces of the insulating layers 22a and 22b for isolation. On the other hand, if the flow rate of HCl was determined to be 0.05 slm (slm: standard liter/min, $0.05 \times 10^{-3}$ $m^3$/min), the deposition rate was increased to 10 nm/min. However, the silicon island 24 was deposited on the upper surfaces of the insulating layers 22a and 22b for isolation similarly as shown in FIG. 3 (b). In addition, in the deposition of the second semiconductor portion 13, the second semiconductor portion 13 may be formed of a silicon-germanium film by further doping monogermane ($GeH_4$). This example is described in detail in the embodiment later described.

Next, the second semiconductor portion 13 grown over the insulating layers 22a and 22b for isolation are removed by a polishing technique such as CMP or surface smoothing processing such as etch-back, as shown in FIG. 14 (g-4). CMP is used in the embodiment. The rough surface of the second semiconductor portion 13 can be smoothened by this processing. This allows the surface shape of the second semiconductor portion 13 which differs by memory cell to be equalized. In addition, the second semiconductor portion 13 can be removed even if the second semiconductor portion is already grown over the insulating layers 22a and 22b for isolation. Therefore, a defect in electrical characteristics never occurs because the short-circuiting of the adjacent second semiconductor portions 13 (floating gates) themselves can be prevented.

Next, the insulating layers 22a and 22b for isolation were removed by about 100 nm by reactive ion etching, as shown in FIG. 15 (h-2). Afterwards, dry chemical etching may be performed on only the corner of the second semiconductor portion 13 to increase the radius of curvature thereof. In addition, the radius of curvature may be increased, for example, by methods such as oxidation in place of performing etching on the corner thereof. In the embodiment, the radius of curvature on the roundness of the corner of the second semiconductor portion 13 was 500 nm. According to the shape of the second semiconductor 13 of the embodiment, the stable operation of the memory cell can be realized because electric field can be reduced during the device operation.

Next, the interpolysilicon insulating film 14 was formed between the floating gate comprising the first semiconductor portion 11 and the second semiconductor portion 13 and the control gate later formed as shown in FIG. 15 (*i*-1). In the embodiment, a so-called ONO film comprising silicon oxide film/silicon nitride film/silicon oxide film was used as the insulating film 14.

Next, phosphorus doped silicon film (P-doped Si film) 15 was formed at a thickness of 100 nm. Subsequently, a tungsten silicide film (WSi film) 16 was formed at a thickness of 85 nm. The silicon film 15 and tungsten silicide film 16 are to be the control gates.

Next, the floating gates were isolated by the memory cell, and the reactive ion etching for patterning the silicon film 15 and the tungsten silicide film 16 for the control gates was performed (not illustrated).

The memory cell 101 was formed by the foregoing processes in the memory cell transistor area 100, and elements for forming circuits to control the memory cell transistor 101 or the like are formed in the peripheral circuit transistor area 200.

In the embodiment, by etching and removing the insulating layers 22*a* and 22*b* for isolation with dilute fluoric acid or the like to reduce the same, the area of the upper surface for forming the second semiconductor portion 13 can be increased and it is possible to increase the area for forming the second semiconductor portion 13.

In addition, in the embodiment, the process explained in the embodiment 6 later described may be used. Namely, the insulating layers 22*a* and 22*b* for isolation may also be designed to be formed after the SiN film 12 is partially etched and removed. A finer processing can be realized by doing so. The finest lithography can be realized when the width of the line and the width of the space is same. Therefore, according to the method of manufacturing the non-volatile semiconductor memory of the embodiment, by performing processings such as partially etching and removing the SiN film 12, processing a mask so as to allow the lines and spaces to be positioned at an equal distance, then, processing the film of the uppermost layer by RIE, etching the side thereof and the like, lines and spaces that are not positioned at an equal distance can be formed, and the cell width and the insulating layers for isolation when completed can be freely controlled.

In addition, if the GPD process explained in the first embodiment is formed to introduce phosphorus, the distance between the surface of the floating gate and the tunnel insulating film interface is shortened by performing GPD after CMP processing, thereby enabling the introduction of phosphorus into the floating gates by a shot-time processing.

In the method of manufacturing the non-volatile semiconductor memory of the embodiment, the process using SiGe explained in the seventh and the eight embodiments later described may be adopted. In this case, the SiGe portion 51 and the silicon portion 52 are determined to be formed as the second semiconductor portion 13.

In addition, in the method of manufacturing the non-volatile semiconductor memory of the embodiment, it is also possible to execute the invention by suitably combining the first to the fourth embodiments with the processes described in the sixth embodiment later described.

Embodiment 6

In the embodiment, in the method of manufacturing the non-volatile semiconductor memory of the first embodiment, the example that the insulating layers 22*a* and 22*b* for isolation are formed is explained after etching is performed on the SiN film 12.

First, refer to FIG. 16. The thermally oxidized film of thickness of 9 nm that was to be the tunnel insulating film on the silicon substrate 1 was formed as shown in FIG. 16 (*b*). Afterwards, the first semiconductor portion (Si film) was formed at a thickness of 40 nm. Subsequently, the silicon nitride film (SiN film) was formed at a thickness of 150 nm. In addition, phosphorus may be or may not be doped to the first semiconductor portion (Si film) 11. Next, the mask material was deposited as shown in FIG. 16 (*b*)

Afterwards, patterning was performed on the SiN film 12, and the opened area that was to be the isolation region was formed as shown in FIG. 16 (*c*-3).

Next, the SiN film was partially removed by phosphoric acid wet etching as shown in FIG. 17 (*c*-4). The opened area d that is to be the isolation region is enlarged by this process.

Afterwards, the first semiconductor portion (Si film) 11 and the silicon substrate 1.0 were etched and removed by Reactive Ion Etching (RIE) to form the portions that were to be the isolation regions a and b as shown in FIG. 17 (*c*-5). In the process shown in FIG. 17 (*c*-5), the second insulating film (Si film) 12 and the silicon substrate 1 may be inversely tapered with a taper angle of 0.3 to 5 degrees, typically about 3 degrees to improve the filling property of the insulating layers for isolation in the next process.

Subsequently, the same processes as the processes shown in FIG. 2 (*d*) to FIG. 6 (*i*) explained in the first embodiment were performed.

In the embodiment, a finer process can be realized because the insulating layers 22*a* and 22*b* for isolation are formed after etching is performed on a part of the SiN film 12 and the opened area d that is to be an isolation region is enlarged. In addition, when the width of the lined and the width of the spaces are same, the finest can be realized. Therefore, according to the method of manufacturing the non-volatile semiconductor memory of the embodiment, by performing processes such as partially etching and removing the SiN film 12, processing the mask so as to allow the lines and the spaces by lithography to be equalized at even intervals, processing the film of the uppermost layer by RIE, and etching the side thereof, the lines and the spaces that are not equalized at even intervals are formed, the cell width and the insulating layers for isolation when completed can be freely controlled.

In addition, in the method of manufacturing the non-volatile semiconductor memory of the embodiment, it is also possible execute the invention by suitably combining the first to the fifth embodiments with the processes described in the seventh and the eight embodiments later described.

Embodiment 7

In the embodiment, in the method of manufacturing the non-volatile semiconductor memory of the embodiment, the invention features a silicon film which is used for the first semiconductor portion on the tunnel insulating film, and a SiGe film and a silicon film which are used for the second semiconductor portion formed thereon. In addition, it is desirable that the portion of the silicon film contacting the interpolysilicon insulating film contains germanium in light of the performance of the device. On the other hand, it is not desirable that germanium appears on the surface halfway in light of the process. Therefore, it is considered that after SiGe is deposited as the second semiconductor portion, a silicon film is deposited as a cap film as explained in the embodiment. In addition, to simplify the process as much as possible while increasing the characteristics of the device, a floating gate comprising the second semiconductor portion of the first semiconductor and a SiGe film only may be used.

In the embodiment, the high deposition rate can be obtained while keeping the same selectivity as in the use of silicon by using SiGe for the second semiconductor portion. SiGe is a useful deposition material if a thermal budget is severe in the device manufacturing process. On the other hand, it is desirable that the first semiconductor portion is formed of silicon. This is because it is highly possible that SiGe will grow to granules if SiGe is directly grown on the tunnel insulating film. In addition, it is desirable that the film that is formed on the SiGe film as the second semiconductor portion is formed of silicon. This is because a surface flow is likely to occur if the exposed surface is SiGe during the formation of the interpolysilicon insulating layer, and it is possible that the interpolysilicon insulating layer is not formed in even thickness on the floating gates.

Because of the foregoing reasons, in the embodiment, the invention includes a three-layered structure which is adopted for the floating gate, and is formed so as to allow silicon/SiGe/silicon to be arranged in order from the side near the tunnel insulating film. In addition, as described above, a two-layer structure may be adopted for the floating gate and it may be formed so as to allow silicon/SiGe to be arranged in order from the side near the tunnel gate insulating film. The manufacturing process is explained below. In addition, in the method of manufacturing the non-volatile semiconductor memory of the embodiment, the processes shown in FIG. 1 (a) to FIG. 4 (e) are not explained again here because they are the same processes as theses explained in the first embodiment.

First, etching processing was performed on the substrate after the process in FIG. 4 (e) was finished with the DHF solution to remove (a natural) oxide film formed on the first semiconductor portion (Si film) 11. A crystalline silicon surface of the first semiconductor portion (Si film) 11 appeared by the oxide film removal processing.

Next, refer to FIG. 18. The substrate was transferred to the depositing tool for LPCVD. Dichlorsilane (DCS), hydrogen chloride (HCl), and phosphine ($PH_3$) were supplied onto the surface of the substrate as precursors, a SiGe film (P-doped SiGe film) 51 where phosphorus was doped to the opened area c was deposited at a thickness of 140 nm as a part of the second semiconductor portion as shown in FIG. 18 (f-3). At the time of the deposition of the SiGe film 51, the substrate temperature was 700 to 750° C., the pressure was 10 Torr (1333.22 Pa), the flow rates of DCS, HCl, $GeH_4$ and $PH_3$ were each 0.5 slm (slm: standard liter/min, $0.5 \times 10^{-3}$ m$^3$/min), 0.1 μm (slm: standard liter/min, $0.1 \times 10^{-3}$ m$^3$/min), 0.02 slm (slm: standard liter/min, $0.02 \times 10^{-3}$ m$^3$/min) and 0.002 slm (slm: standard liter/min, $0.002 \times 10^{-3}$ m$^3$/min). In addition, the deposition rate was 6 nm/min. In case of these deposition conditions, the SiGe film 51 was not deposited over the insulating layers 22a and 22b for isolation. On the other hand, if the HCl flow rate was determined to be 0.05 slm (slm: standard liter/min, $0.05 \times 10^{-3}$ m$^3$/min), the deposition rate was increased to 10 nm/min. However, the SiGe island was deposited on the insulating layers 22a or 22b for isolation similarly as shown in FIG. 3 (b). In addition, in the deposition of the SiGe film 51, the SiGe film was deposited at a thickness so as not to allow the SiGe film 51 to be deposited over the entire upper surfaces of the insulating layers 22a and 22b for isolation. According to the conditions in the embodiment, the germanium concentration in the SiGe film 51 was about 20% (atomic %). In addition, it is desirable that the germanium concentration in the SiGe film 51 is 10% or more and 80% or less. If the germanium concentration in the SiGe film 51 is less than 10%, the desired effects are barley obtained by doping the germanium in light of both the process and the device. In addition, if it is more than 80%, it is difficult to obtain a smooth surface at the time of the deposition because the oxide film formed on the SiGe film 51 does not grow evenly and excellent electrical characteristics can not be obtained.

Subsequently, the supply of germane ($GeH_4$) is stopped, the silicon film 52 was deposited at a thickness of 20 nm as a part of the second semiconductor portion as shown in FIG. 18 (f-4). The conditions of the substrate temperature and the flow rates of each gas and the like are determined to be the same as those explained in FIG. 4 (f) in the embodiment. Through such processes, a three-layer structure of the first semiconductor portion 11, the SiGe film 51 that is the second semiconductor portion and the silicon film 52 can be obtained. In addition, in the embodiment, even if the silicon film 52 was formed on the SiGe film 51, the silicon film 52 may not be formed on the SiGe film 51, and the SiGe film 51 may be determined to be the uppermost surface of the floating gates. In addition, after the SiGe film 52 and the silicon film 52 are formed, thermal processing may be performed to diffuse germanium (Ge) to the interpolysilicon insulating film 10. In this case, the silicon film 52 is not formed on the SiGe film 51, while, one of an electrical property the same as in the SiGe film 51 that is to be the uppermost surface of the floating gate is obtained.

Next, the silicon film 52 grown on the insulating layers 22a and 22b for isolation was etched and moved by a polishing technique such as CMP or surface smoothing processing such as etch-back, as shown in FIG. 19 (g-5) CMP was used in the embodiment. This processing allows the rough surface of the silicon film 52 to be smoothed. This allows the surface shapes of the silicon film 52 which differ by memory cell to be equalized. In addition, this processing allows the short-circuitting of the adjacent SiGe film 51 and/or the silicon film 52 (floating gate) themselves to be prevented, thereby resulting in no defect in electrical characteristics, because the SiGe film 51 and/or the silicon film 52 can be removed even if they are already grown over the insulating layers 22a and 22b for isolation.

Subsequently, the processing by the processes after FIG. 5 (h) explained in the first embodiment was performed.

As explained above, in the embodiment, the high deposition rate can be obtained while keeping the same selectivity as in the case that silicon is used and keeping excellent electrical characteristics by using SiGe as the second semiconductor portion.

In addition, in the method of manufacturing the non-volatile semiconductor memory of the embodiment, it is also possible to execute the invention by suitably combining the first to the sixth embodiments with the processes described in the sixth to the eight embodiments later described.

Embodiment 8

In the embodiment, in the method of manufacturing the non-volatile semiconductor memory of the first embodiment, the invention includes a silicon film which is used for the first semiconductor portion on the insulating layer, and the SiGe film and the silicon film are used for the second semiconductor portion formed thereon. In addition, to simplify the processes as much as possible while increasing the characteristics of the device, the floating gate comprising the first semiconductor portion and the SiGe film only may be used and the floating gate may be formed so as to allow silicon/SiGe to be arranged in order from the side near the tunnel insulating film.

The process of manufacturing the same is explained in detail below. In addition, in the method of manufacturing the non-volatile semiconductor memory of the embodiment, the processes shown in FIG. 1 (*a*) to FIG. 4 (*e*) are not explained again here because they are the same processes explained in the first embodiment.

First, etching processing was performed on the substrate on which the process in FIG. 4 (*e*) was finished with the DHF solution to remove (a natural) oxide film formed on the surface of the first semiconductor portion (Si film) 11. A crystalline silicon surface of the first semiconductor portion (Si film) 11 appeared by the oxide film removal processing.

Next, refer to FIG. 20. The substrate was transferred to the depositing tool for LPCVD. Dichlorsilane (DCS), hydrogen chloride (HCl), germane (GeH$_4$) and phosphine (PH$_3$) were supplied onto the surface of the substrate as precursors, a SiGe film (P-doped Si film) 51 where phosphorus was doped as a part of the second semiconductor portion to the opened area c was deposited at a thickness of 140 nm, as shown in FIG. 20 (*f*-3). At the time of the deposition of the SiGe film 51, the substrate temperature was 700 to 750° C., the pressure was 10 Torr (1333.22 Pa), the flow rates of DCS, HCl, GeH$_4$ and PH$_3$ were each 0.5 slm (slm: standard liter/min, $0.5 \times 10^{-3}$ m$^3$/min), 0.1 slm (slm: standard liter/min, $0.1 \times 10^{-3}$ m$^3$/min), 0.02 slm (slm: standard liter/min, $0.02 \times 10^{-3}$ m$^3$/min) and 0.002 slm (slm: standard liter/min, $0.002 \times 10^{-3}$ m$^3$/min). In addition, the deposition rate was 6 nm/min. In case of this deposition condition, the SiGe 51 was not deposited on the upper surfaces of the insulating layers 22*a* and 22*b* for isolation. On the other hand, if the HCl flow rate was determined to be 0.05 slm (slm: standard liter/min, $0.05 \times 10^{-3}$ m$^3$/min), the deposition rate was increased to 10 nm/min. However, the SiGe island was deposited on the upper surfaces of the insulating layers for isolation similarly as in FIG. 3 (*b*) In addition, in the deposition of the SiGe film 51, the SiGe film was deposited so as not to allow the SiGe film 51 to be deposited over the entire surfaces of the insulating layers for isolation in thickness. In addition, it is desirable that the germanium concentration in the SiGe film 51 is 10% or more and 80% or less. If the germanium concentration in the SiGe film 51 is less than 10%, the effect of doping germanium is barely obtained in light of the process and the device. If it is more than 80%, it is difficult to obtain a smooth surface at the time of deposition, because the oxide film formed on the SiGe film 51 does not grow evenly, thereby resulting in no excellent electrical characteristics.

Next, the insulating layers 22*a* and 22*b* for isolation were etched and removed with a solution as shown in FIG. 20 (*f*-5). The aqueous solution containing fluoric acid was used for etching, and the insulating layers 22*a* and 22*b* for isolation were removed by about 5 nm. The side formed in the opened area c of the SiGe film 51 is designed to be exposed by such a processing.

Next, the substrate was transferred to the depositing tool for LPCVD. Dichlorsilane (DCS), hydrogen chloride (HCl), and phosphine (PH$_3$) were supplied onto the surface of the substrate as precursors, a silicon film (P-doped Si film) 52 where phosphorus was doped as a part of the second semiconductor portion to the opened area c was deposited at a thickness of 20 nm, as shown in FIG. 21 (*f*-6) At the time of the deposition of the silicon film 13, the substrate temperature was 750° C., the pressure was 10 Torr (1333.22 Pa), the flow rates of DCS, HCl, and PH$_3$ were each 0.5 μm (slm: standard liter/min, $0.5 \times 10^{-3}$ m$^3$/min), 0.1 μm (slm: standard liter/min, $0.1 \times 10^{-3}$ m$^3$/min), and 0.002 μm (slm: standard liter/min, $0.002 \times 10^3$ m$^3$/min). In addition, the deposition rate was 0.44 nm/min. In case of this deposition condition, silicon was not deposited on the upper surfaces of the insulating layers 22*a* and 22*b* for isolation.

Through such processes, a three-layered structure comprising the first semiconductor portion 11, the SiGe film 51 as the second semiconductor portion, and the silicon film 52 can be obtained.

Next, the silicon film 52 grown on the insulating layers 22*a* and 22*b* for isolation were etched and removed by a polishing technique such as CMP or a surface smoothing processing such as etch-back, as shown in FIG. 21 (*g*-6)

CMP was used in the embodiment. This processing allows the rough surface of the silicon film 52 to be smoothed. This allows the surface shapes of the silicon film 52 which differ by memory cell to be equalized. In addition, this processing allows the short-circuitting of the adjacent silicon films 52 (floating gates) themselves to be prevented, thereby resulting in no defect in electrical characteristics, because the silicon films 52 can be removed even if the silicon films 52 is already grown over the insulating layers 22*a* and 22*b* for isolation.

Subsequently, the processes after FIG. 5 (*h*) explained in the first embodiment were performed.

In the embodiment, the silicon film 52 can be formed so as to enclose the SiGe film 51 by forming the silicon film 52 after a part of the insulating layers 22*a* and 22*b* for isolation was removed by isotropic etching following the formation of the SiGe film 51. Therefore, it is possible to allow the SiGe film 51 to be exposed even if the insulating layers 22*a* and 22*b* for isolation were removed by the process shown in FIG. 5 (*h*).

Therefore, in the embodiment, the floating gates have a three-layered structure and are formed so as to allow silicon/SiGe/silicon to be arranged in order from the side near the tunnel gate insulating film 10, and at least a part thereof on the side of the SiGe film is covered with the silicon film.

In addition, in the method of manufacturing the non-volatile semiconductor memory of the embodiment, it is also possible to execute the invention by suitably combining the processes explained in the first to the seventh embodiments.

What we claim are:

1. A method for manufacturing a non-volatile semiconductor device comprising:

forming a plurality of first semiconductor portions over a substrate;

forming a plurality of insulating films over said plurality of first semiconductor portions;

forming a plurality of insulating structures having sidewalls inclined at a taper angle with respect to a line perpendicular to said substrate, upper surfaces of said insulating structures:

having widths greater than lower surfaces of said insulating structures, and being at same heights as upper surfaces of said insulating films;

removing said insulating films;

selectively growing a plurality of second semiconductor portions respectively using said plurality of first semiconductor portions as seeds;

removing upper portions of said plurality of second semiconductor portions to form a plurality of floating gates with substantially flat upper surfaces, said upper surfaces of said floating gates being at same heights as upper surfaces of said insulating structures;

forming an insulating layer over said plurality of floating gates; and forming a control gate over said insulating layer.

2. The method for manufacturing a non-volatile semiconductor device according to claim 1, wherein selectively growing a plurality of second semiconductor portions comprises selectively growing a plurality of SiGe portions using said plurality of first semiconductor portions as seeds.

3. The method for manufacturing a non-volatile semiconductor device according to claim 1, wherein selectively growing a plurality of second semiconductor portions comprises:
  forming a plurality of SiGe portions; and
  selectively forming a plurality of silicon portions using corresponding ones of said plurality of SiGe portions as seeds.

4. The method for manufacturing a non-volatile semiconductor device according to claim 1, wherein selectively growing a plurality of second semiconductor portions comprises selectively growing P-doped silicon material using said plurality of first semiconductor portions as seeds.

5. The method for manufacturing a non-volatile semiconductor device according to claim 1, wherein:
  said taper angle is in a range of 0.3-5 degrees.

6. The method for manufacturing a non-volatile semiconductor device according to claim 1, wherein forming the plurality of insulating structures comprises:
  partially etching said substrate to form trenches; and
  filling insulating materials in said trenches.

7. The method for manufacturing a non-volatile semiconductor device according to claim 1, further comprising:
  partially etching said plurality of insulating structures before forming the insulating layer over said plurality of floating gates.

8. The method for manufacturing a non-volatile semiconductor device according to claim 1, further comprising:
  partially etching said second semiconductor portions to round edges of said second semiconductor portions.

9. The method for manufacturing a non-volatile semiconductor device according to claim 1, further comprising:
  partially oxidizing said second semiconductor portions to round edges of said second semiconductor portions.

10. The method for manufacturing a non-volatile semiconductor device according to claim 1, wherein said plurality of first semiconductor portions include amorphous silicon or polycrystalline silicon.

11. The method for manufacturing a non-volatile semiconductor device according to claim 1, wherein said step of selectively growing uses $H_2$ and/or $N_2$ as carrier gas.

12. The method for manufacturing a non-volatile semiconductor device according to claim 3, wherein germanium concentration of said SiGe portions is between 10% and 80%.

* * * * *